US012218408B2

(12) United States Patent
Thai et al.

(10) Patent No.: US 12,218,408 B2
(45) Date of Patent: Feb. 4, 2025

(54) ANTENNA BOARDS AND COMMUNICATION DEVICES

(71) Applicant: Intel Corporation, Santa Clara, CA (US)

(72) Inventors: Trang Thai, Hillsboro, OR (US); Sidharth Dalmia, Portland, OR (US); Raanan Sover, Haifa (IL); Josef Hagn, Taufkirchena (DE); Omer Asaf, Oranit M (IL); Simon Svendsen, Aalborg (DK)

(73) Assignee: Intel Corporation, Santa Clara, CA (US)

(*) Notice: Subject to any disclaimer, the term of this patent is extended or adjusted under 35 U.S.C. 154(b) by 324 days.

(21) Appl. No.: 17/231,051

(22) Filed: Apr. 15, 2021

(65) Prior Publication Data
US 2021/0234260 A1 Jul. 29, 2021

Related U.S. Application Data

(63) Continuation of application No. 15/977,612, filed on May 11, 2018, now Pat. No. 11,011,827.

(51) Int. Cl.
*H01Q 1/24* (2006.01)
*H01L 23/64* (2006.01)
(Continued)

(52) U.S. Cl.
CPC ........... *H01Q 1/243* (2013.01); *H01L 23/645* (2013.01); *H01L 23/66* (2013.01); *H01Q 9/0407* (2013.01);
(Continued)

(58) Field of Classification Search
CPC ........ H01Q 1/243; H01Q 9/0414; H01Q 1/38; H01Q 21/065; H01Q 21/08; H01Q 9/0407;
(Continued)

(56) References Cited

U.S. PATENT DOCUMENTS 6,008,763 A 12/1999 Nystrom et al.
6,809,688 B2 10/2004 Yamada
(Continued)

FOREIGN PATENT DOCUMENTS

CN 106887690 A 6/2017
CN 107534223 B 10/2020
(Continued)

OTHER PUBLICATIONS

Non Final Office Action in U.S. Appl. No. 15/939,806 dated Jul. 6, 2021, 17 pages.
(Continued)

*Primary Examiner* — Dimary S Lopez Cruz
*Assistant Examiner* — Yonchan J Kim
(74) *Attorney, Agent, or Firm* — Akona IP PC

(57) ABSTRACT

Disclosed herein are antenna boards, antenna modules, and communication devices. For example, in some embodiments, an antenna board may include: an antenna feed substrate including an antenna feed structure, wherein the antenna feed substrate includes a ground plane, the antenna feed structure includes a first portion perpendicular to the ground plane and a second portion parallel to the ground plane, and the first portion is electrically coupled between the second portion and the first portion; and a millimeter wave antenna patch.

37 Claims, 16 Drawing Sheets

(51) Int. Cl.
*H01L 23/66* (2006.01)
*H01Q 9/04* (2006.01)
*H01Q 21/06* (2006.01)

(52) U.S. Cl.
CPC ......... *H01Q 9/0414* (2013.01); *H01Q 21/065* (2013.01)

(58) Field of Classification Search
CPC ......... H01Q 1/22; H01L 23/645; H01L 23/66; H01L 2223/6677; H01L 2224/16227; H01L 2924/15311; H01L 2924/3025
See application file for complete search history.

(56) References Cited

U.S. PATENT DOCUMENTS

| | | | |
|---|---|---|---|
| 6,870,438 | B1 | 3/2005 | Shino et al. |
| 7,265,719 | B1 | 9/2007 | Moosbrugger et al. |
| 7,289,069 | B2 | 10/2007 | Ranta |
| 9,196,965 | B2 | 11/2015 | Sabielny |
| 9,425,502 | B2 | 8/2016 | Chen et al. |
| 9,620,464 | B2 | 4/2017 | Baks et al. |
| 11,011,827 | B2 | 5/2021 | Thai et al. |
| 2002/0122006 | A1 | 9/2002 | Crawford |
| 2002/0124392 | A1 | 9/2002 | Chung |
| 2004/0090369 | A1 | 5/2004 | Mccarrick |
| 2004/0227683 | A1 | 11/2004 | Caimi et al. |
| 2005/0245001 | A1 | 11/2005 | Hyvonen et al. |
| 2006/0001572 | A1 | 1/2006 | Gaucher et al. |
| 2007/0126638 | A1 | 6/2007 | Channabasappa |
| 2007/0159380 | A1 | 7/2007 | Nagaishi et al. |
| 2007/0200146 | A1 | 8/2007 | Onishi et al. |
| 2008/0204238 | A1 | 8/2008 | White |
| 2009/0251356 | A1 | 10/2009 | Margomenos |
| 2009/0256752 | A1 | 10/2009 | Akkermans et al. |
| 2009/0303135 | A1 | 12/2009 | Reed et al. |
| 2010/0073238 | A1 | 3/2010 | Jun et al. |
| 2010/0090903 | A1* | 4/2010 | Byun ............... H01Q 9/0414 343/700 MS |
| 2010/0113111 | A1 | 5/2010 | Wong et al. |
| 2010/0164783 | A1 | 7/2010 | Choudhury et al. |
| 2010/0327068 | A1 | 12/2010 | Chen et al. |
| 2011/0079917 | A1 | 4/2011 | Xia et al. |
| 2012/0119954 | A1 | 5/2012 | Chen |
| 2012/0235881 | A1 | 9/2012 | Pan et al. |
| 2013/0016023 | A1 | 1/2013 | Gaucher et al. |
| 2013/0118008 | A1 | 5/2013 | Gaynes et al. |
| 2013/0189935 | A1 | 7/2013 | Nair et al. |
| 2013/0207274 | A1 | 8/2013 | Liu et al. |
| 2014/0145883 | A1 | 5/2014 | Baks et al. |
| 2014/0266973 | A1 | 9/2014 | Devries et al. |
| 2015/0123744 | A1 | 5/2015 | Nishimura et al. |
| 2015/0129668 | A1 | 5/2015 | Kam et al. |
| 2015/0234035 | A1 | 8/2015 | Lohoefener et al. |
| 2015/0364815 | A1 | 12/2015 | Yong et al. |
| 2016/0049723 | A1 | 2/2016 | Baks et al. |
| 2016/0172761 | A1 | 6/2016 | Garcia et al. |
| 2016/0261047 | A1 | 9/2016 | Wallace et al. |
| 2016/0308563 | A1 | 10/2016 | Ouyang et al. |
| 2017/0125895 | A1* | 5/2017 | Baks ............... H01Q 1/22 |
| 2017/0179612 | A1 | 6/2017 | Kamgaing et al. |
| 2017/0214121 | A1 | 7/2017 | Ganchrow et al. |
| 2017/0250120 | A1 | 8/2017 | Harauchi et al. |
| 2017/0353338 | A1 | 12/2017 | Amadjikpe et al. |
| 2018/0005957 | A1 | 1/2018 | Vincent et al. |
| 2018/0026341 | A1 | 1/2018 | Mow et al. |
| 2018/0034134 | A1 | 2/2018 | Dalmia |
| 2018/0048050 | A1 | 2/2018 | Sayem et al. |
| 2018/0090816 | A1 | 3/2018 | Mow et al. |
| 2019/0020114 | A1* | 1/2019 | Paulotto ............ H01Q 9/40 |
| 2019/0037229 | A1 | 1/2019 | Kim et al. |
| 2019/0103653 | A1 | 4/2019 | Jeong et al. |
| 2019/0131691 | A1 | 5/2019 | Hong et al. |
| 2019/0173176 | A1 | 6/2019 | Kim et al. |
| 2019/0181126 | A1 | 6/2019 | Cheah et al. |
| 2019/0260110 | A1 | 8/2019 | Thai et al. |
| 2019/0305402 | A1 | 10/2019 | Dalmia et al. |
| 2019/0305430 | A1 | 10/2019 | Thai et al. |
| 2019/0333882 | A1* | 10/2019 | Kamgaing ........... H01Q 9/0414 |
| 2019/0372198 | A1 | 12/2019 | Dalmia et al. |
| 2020/0253040 | A1 | 8/2020 | Dalmia et al. |
| 2020/0266549 | A1* | 8/2020 | Yamamoto .......... H01Q 1/2283 |
| 2020/0403316 | A1 | 12/2020 | Dalmia et al. |
| 2021/0234260 | A1 | 7/2021 | Thai et al. |
| 2022/0246571 | A1 | 8/2022 | Zhu et al. |

FOREIGN PATENT DOCUMENTS

| | | |
|---|---|---|
| CN | 111869008 A | 10/2020 |
| CN | 111886755 A | 11/2020 |
| EP | 1777551 A2 | 4/2007 |
| JP | 2005019649 A | 1/2005 |
| JP | 2009065321 A | 3/2009 |
| JP | 2010538542 A | 12/2010 |
| JP | 2017028245 A | 2/2017 |
| JP | 3213873 U | 12/2017 |
| JP | 2018032890 B | 3/2019 |
| KR | 200406775 Y1 | 1/2006 |
| KR | 100620015 B1 | 9/2006 |
| KR | 20170016377 A | 2/2017 |
| KR | 101780024 B1 | 9/2017 |
| KR | 1020170128673 A | 11/2017 |
| TW | 200952251 A | 12/2009 |
| TW | 201340629 A | 10/2013 |
| TW | 201433003 A | 8/2014 |
| TW | I463736 B | 12/2014 |
| TW | 201622076 A | 6/2016 |
| TW | 201707179 A | 2/2017 |
| TW | 201724417 A | 7/2017 |
| TW | 201743415 A | 12/2017 |
| WO | 2011031668 A1 | 3/2011 |
| WO | 2018063497 A1 | 4/2018 |

OTHER PUBLICATIONS

Ayman Abbosh et al., "Flexible CPW-IFA antenna for wearable electronic devices," 2014 IEEE Antennas and Propagation Society International Symposium [online], Sep. 22, 2014 [retrieved on Jul. 19, 2019]. Retrieved from the Internet. See p. 1720; and figures 1-2.
Non Final Office Action in U.S. Appl. No. 15/939,139 dated Dec. 23, 2020, 16 pages.
Notice of Allowance in U.S. Appl. No. 16/000,795 dated Jun. 11, 2020, 9 pages.
PCT International Search Report and Written Opinion issued in PCT/US2019/014645 on May 15, 2019; 11 pages.
PCT International Search Report and Written Opinion issued in PCT/US2019/020057 on Jun. 14, 2019; 12 pages.
PCT International Search Report and Written Opinion issued in PCT/US2019/020066 on Jun. 24, 2019; 11 pages.
PCT International Search Report and Written Opinion issued in PCT/US2019/026904 on Jul. 26, 2019; 14 pages.
PCT International Search Report and Written Opinion issued in PCT/US2019/029581 on Aug. 13, 2019; 12 pages.
PCT International Search Report and Written Opinion issued in PCT/US2019/030838 on Aug. 22, 2019; 14 pages.
Wonbin, Hong., "Millimeter-Wave Antennas and Arrays," Handbook of Antenna Technologies [online] Sep. 16, 2016 [retrieved on Jul. 19, 2019]. Retrieved from the Internet. See pp. 1807-1808, 1842; and figures 14(a)-14(b), 47, 50(a)-50(b), 51, 53.
Non Final Office Action in U.S. Appl. No. 15/939,180 dated Jul. 30, 2021, 10 pages.
"Flexible flat cable", Wikipedia, https://en.wikipedia.org/wiki/Flexible_flat_cable, retrieved from the internet on Apr. 9, 2024, 3 pages.

* cited by examiner

12,218,408 B2

ANTENNA BOARDS AND COMMUNICATION DEVICES

CROSS REFERENCE TO RELATED APPLICATION

This Application is a continuation (and claims the benefit of priority under 35 U.S.C. § 120) of U.S. application Ser. No. 15/977,612, filed May 11, 2018 and entitled ANTENNA BOARDS AND COMMUNICATIONS DEVICES. The disclosure of the prior Applications is considered part of and is incorporated by reference in the disclosure of this Application.

BACKGROUND

Wireless communication devices, such as handheld computing devices and wireless access points, include antennas. The frequencies over which communication may occur may depend on the shape and arrangement of the antennas, among other factors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1:
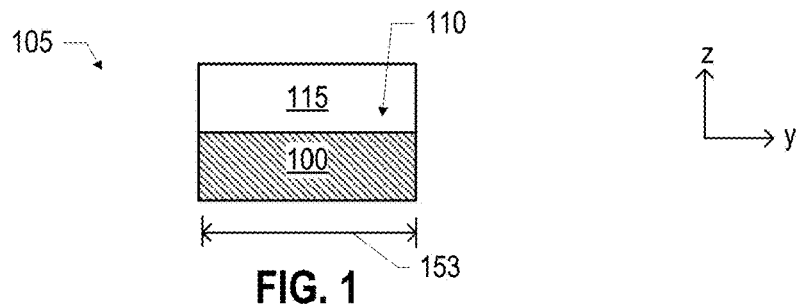
FIG. 1 is a side, cross-sectional view of an antenna module, in accordance with various embodiments.

Disclosed herein are antenna boards, antenna modules, and communication devices. For example, in some embodiments, an antenna board may include: an antenna feed substrate including an antenna feed structure, wherein the antenna feed substrate includes a ground plane, the antenna feed structure includes a first portion perpendicular to the ground plane and a second portion parallel to the ground plane, and the first portion is electrically coupled between the second portion and the first portion; and a millimeter wave antenna patch.

At millimeter wave frequencies, antenna arrays integrated into electronic devices (e.g., mobile devices, such as handheld phones) may suffer significant losses due to de-tuning, absorption, and/or radiation pattern distortion. For example, in a mobile device environment, an antenna array may be inside a housing that includes a plastic or glass back cover, a metallic chassis, a metallic front display, and/or a metallic phone edge. The antenna array(s) may be located proximate to the phone edge. For conventional antennas designed for free space operation, operation in such a "real" electronic device environment may experience losses due to mismatch between the power amplifier signal and the antenna terminal, undesired reflection and surface waves at the glass/air interface (which may result in low radiation efficiency and radiation pattern distortion that induces undesired side lobes), and/or dielectric absorption of the plastic or glass back cover (which may also contribute to low radiation efficiency). For example, integration of a conventional antenna design into a mobile device environment may result in a 6-8 dB return loss level and a bandwidth reduced by half.

Various ones of the antenna boards and communication devices disclosed herein may exhibit improved performance to enable millimeter wave operation in mobile device and other electronic device environments. As discussed below, the designs disclosed herein may enable the antenna boards and communication devices disclosed herein to achieve broad bandwidth operation with high return loss and high gain. For example, some of the low cost, high yield designs disclosed herein may include air cavities that improve the impedance bandwidth and radiation efficiency over the operational bandwidth. The antenna board and communication device designs disclosed herein may be advantageously included in mobile devices, base stations, access points, routers, backhaul communication links, and other communication devices.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "integrated circuit (IC) package" are synonymous. When used to describe a range of dimensions, the phrase "between X and Y" represents a range that includes X and Y. For convenience, the phrase "FIG. 17" may be used to refer to the collection of drawings of FIGS. 17A-17B.

Any of the features discussed with reference to any of accompanying drawings herein may be combined with any other features to form an antenna board 100, an antenna module 105, or a communication device 151, as appropriate. A number of elements of the drawings are shared with others of the drawings; for ease of discussion, a description of these elements is not repeated, and these elements may take the form of any of the embodiments disclosed herein.

FIG. 1 is a side, cross-sectional view of an antenna module 105, in accordance with various embodiments. The antenna module 105 may include an IC package 115 coupled to an antenna board 100. Although a single IC package 115 and a single antenna board 100 are illustrated in FIG. 1, an antenna module 105 may include more than one IC package 115 and/or one or more antenna boards 100 (e.g., as discussed below with reference to FIG. 27). As discussed in further detail below, the antenna board 100 may include conductive pathways (e.g., provided by conductive vias and lines through one or more dielectric materials) and feed structures 118 (including, e.g., striplines, microstriplines, or coplanar waveguides) (not shown) that may enable one or more antenna patches 104 (not shown) to transmit and receive electromagnetic waves under the control of circuitry in the IC package 115. In some embodiments, the IC package 115 may be coupled to the antenna board 100 by second-level interconnects (not shown, but discussed below with reference to FIG. 26). For example, the antenna board 100 may be surface mounted to the IC package 115. In some embodiments, at least a portion of the antenna board 100 may be fabricated using printed circuit board (PCB) technology, and may include between two and eight PCB layers. Examples of IC packages 115 and antenna boards 100 are discussed in detail below. In some embodiments, an antenna module 105 may include a different IC package 115 for controlling each different antenna patch 104; in other embodiments, an antenna module 105 may include one IC package 115 having circuitry to control multiple antenna patches 104. In some embodiments, the total z-height of an antenna module 105 may be less than 3 millimeters (e.g., between 2 millimeters and 3 millimeters).

Figure 2:
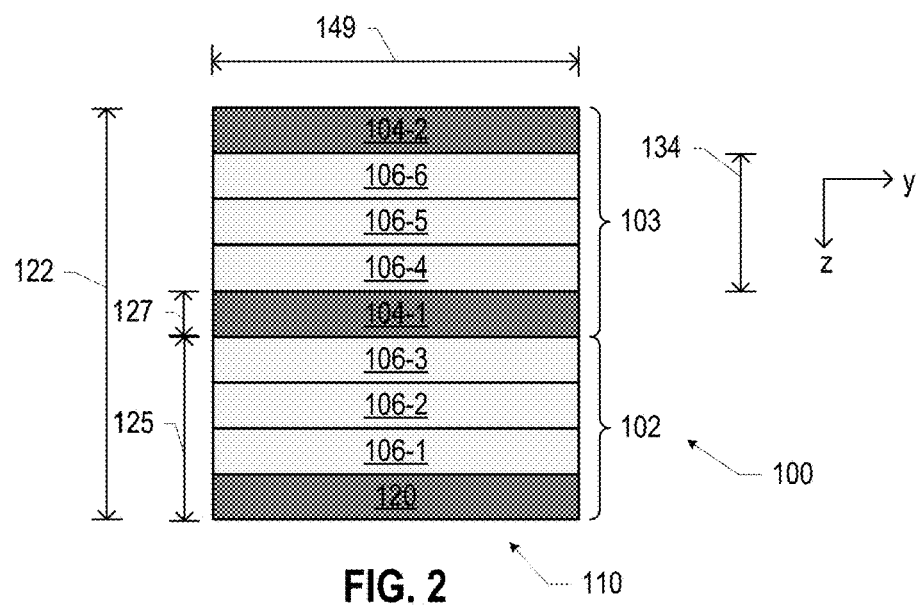
FIG. 2 is a generalized representation of a side view of a portion of an example antenna board, in accordance with various embodiments.

FIG. 1 is a generalized representation of a side view of an example antenna board 100, in accordance with various embodiments. An antenna board 100 may include an antenna feed substrate 102 and one or more antenna patches 104. FIG. 2 illustrates two antenna patches 104-1 and 104-2, but an antenna board 100 may include one antenna patch 104 (e.g., as discussed below with reference to FIGS. 3-5) or more than two antenna patches 104. The antenna feed substrate 102 may include conductive pathways (e.g., provided by conductive vias and lines through one or more dielectric materials, not shown in FIG. 2) and feed structures 118 (not shown). In some embodiments, at least a portion of the antenna feed substrate 102 may be fabricated using PCB technology, and may include between two and eight PCB layers.

The antenna feed substrate 102 may include a ground plane 120 and one or more permittivity regions 106 between the ground plane 120 and the antenna patch 104 closest to the ground plane 120. In the embodiment of FIG. 2, that antenna patch 104 is the antenna patch 104-1. Different permittivity regions 106 may have different dielectric constants (e.g., due to different material compositions). In FIG. 2, three different permittivity regions 106-1, 106-2, and 106-3 are illustrated in the antenna feed substrate 102, but an antenna feed substrate 102 may include more or fewer permittivity regions 106 between the ground plane 120 and the antenna patch 104-1. A number of examples of different antenna feed substrates 102 including various numbers and kinds of permittivity regions 106 are discussed herein. Although the ground plane 120 is shown as disposed at the bottom face 110 of the antenna feed substrate 102, the antenna feed substrate 102 may include more layers and structures "below" the ground plane 120; the ground plane 120 is shown at the bottom face 110 for ease of illustration in various ones of the accompanying figures, but other metal layers may be present between the ground plane 120 and the physical bottom face 110 of the antenna feed substrate 102.

Conductive structures in an antenna board 100 (e.g., the ground plane 120, the feed structure(s) 118, conductive contacts 117, the antenna patch(es) 104, etc.) may be formed of any suitable conductive material (e.g., a metal, such as copper). A dielectric material, such as a solid dielectric material or air, may be disposed around various ones of the conductive structures. Any suitable solid dielectric material may be used (e.g., a laminate material). In some embodiments, the dielectric material may be an insulating material used in package substrate technologies, such as an organic dielectric material, a fire retardant grade 4 material (FR-4), bismaleimide triazine (BT) resin, ceramic materials, polyimide materials, glass reinforced epoxy matrix materials, or low-k and ultra low-k dielectric (e.g., carbon-doped dielectrics, fluorine-doped dielectrics, porous dielectrics, and organic polymeric dielectrics).

Some or all of the antenna patches 104 in an antenna board 100 may be arranged in a stack 103. A stack 103 of multiple antenna patches 104 may exhibit higher gain and higher directivity than a single antenna patch 104, and the gain and directivity improvements may increase with the number of antenna patches 104 in the stack 103. When a stack 103 includes multiple antenna patches 104, different antenna patches 104 in a stack 103 may be separated by one or more permittivity regions 106. In FIG. 2, three different permittivity regions 106-4, 106-5, and 106-6 are illustrated in the stack 103, but a stack 103 may include more or fewer permittivity regions 106 between adjacent antenna patches 104. In embodiments in which a stack 103 includes more than two antenna patches 104, any adjacent pair of antenna patches 104 in the stack 103 may be separated by one or more permittivity regions (e.g., in accordance with any of the embodiments discussed herein with reference to the antenna patches 104-1 and 104-2). A number of examples of different stacks 103 including various numbers and kinds of permittivity regions 106 are discussed herein. In particular, FIGS. 3-9 illustrate various examples of different stacks 103, while FIGS. 10-16 illustrate various examples of different antenna feed substrates 102 and/or the coupling between an antenna feed substrate 102 and a stack 103; any of the stacks 103 of FIGS. 3-9 may be included in an antenna board 100 with any of the antenna feed substrates 102 and/or via any of the couplings of FIGS. 10-16. In some embodiments, one or more of the antenna patches 104 in an antenna board 100 may include an aperture therein (e.g., a cross-shaped aperture). Although various ones of the examples of stacks 103 that include multiple antenna patches 104 may illustrate those antenna patches 104 as having their centers aligned (e.g., so that one antenna patch 104 is directly above another), this need not be the case; multiple antenna patches 104 in a stack 103 may be horizontally offset from each other, as desired (e.g., as discussed below with reference to FIGS. 23 and 24).

Figure 23:
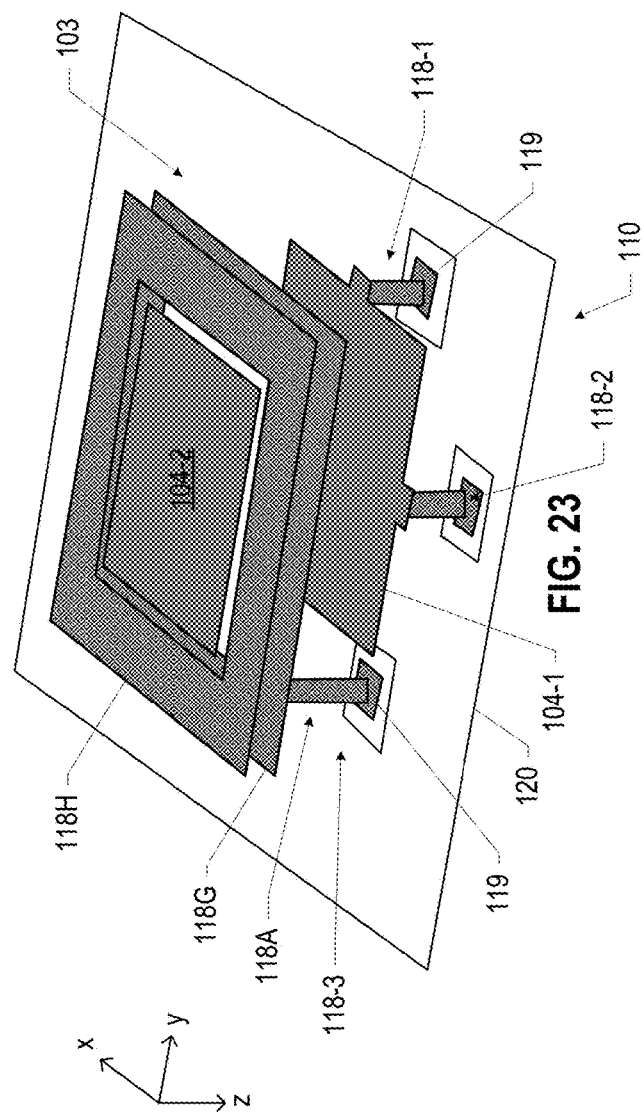
FIGS. 23-24 are perspective views of example structures that may be included in an antenna board, in accordance with various embodiments.

Any of the antenna patches 104 included in any of the antenna boards 100 disclosed herein may have any suitable shape. For example, in some embodiments, an antenna patch 104 may have a rectangular footprint. In some embodiments, an antenna patch 104 with a substantially rectangular (or other) footprint may have "extensions" to which feed structures 118 are coupled; an example of such an embodiment is illustrated in FIG. 23. Although the antenna patches 104 illustrated in the accompanying drawings are "solid," an antenna patch 104 may have one or more apertures therein, and these apertures may have any desired shape. For example, in some embodiments, an antenna patch 104 may have a rectangular aperture therein. In some embodiments, an antenna patch 104 may have a slot or cross-shaped aperture therein.

In some of the embodiments disclosed herein, one of the permittivity regions 106-1, 106-2, or 106-3 may include air (i.e., an air cavity 112, shown in various of the accompanying drawings, may be present between the antenna patch 104-1 and the ground plane 120); additionally or alternatively, in some embodiments, one of the permittivity regions 106-4, 106-5, and 106-6 may include air (i.e., an air cavity 112, shown in various of the accompanying drawings, may be present between the antenna patch 104-1 and the antenna patch 104-2).

In some embodiments, the antenna patches 104 may be electrically coupled to the antenna feed substrate 102 by electrically conductive material pathways through the antenna feed substrate 102 that make conductive contact with electrically conductive material of the antenna patches 104, while in other embodiments, the antenna patches 104 may be mechanically coupled to the antenna feed substrate 102 but may not be in contact with an electrically conductive material pathway through the antenna feed substrate 102. Various examples of these embodiments are discussed below. Generally, any of the embodiments disclosed herein in which the antenna feed substrate 102 is not coupled to one or more of the antenna patches 104 by an electrically conductive material pathway may be modified to include such a pathway (e.g., using a mechanical connection provided by solder 140 to also feed the one or more antenna patches 104, as discussed below).

Although a single stack 103 of antenna patches 104 is depicted in FIG. 2 (and others of the accompanying drawings), this is simply illustrative, and an antenna board 100 may include more than one stack 103 of antenna patches 104 (e.g., arranged in an array at a face of the antenna feed substrate 102). For example, an antenna board 100 may include four stacks 103 (e.g., arranged in a linear array), eight stacks 103 (e.g., arranged in one linear array, or two linear arrays), sixteen stacks 103 (e.g., arranged in a 4×4 array), or thirty-two stacks 103 (e.g., arranged in two 4×4 arrays).

The dimensions of the antenna boards 100 disclosed herein may take any suitable values. For example, in some embodiments, a thickness 125 of the antenna feed substrate 102 may be less than 1 millimeter (e.g., between 0.1 millimeters and 0.5 millimeters) for communications in the 20 gigahertz to 40 gigahertz range. In some embodiments, a thickness 127 of an antenna patch 104 may be less than a quarter of the wavelength of the center frequency to be transmitted/received. For example, a thickness 127 of an antenna patch 104 may be less than 1 millimeter (e.g., between 0.2 millimeters and 0.7 millimeters). In some embodiments, a lateral dimension 153 of an antenna board 100 may be between 2 millimeters and 6 millimeters (e.g., for communications in the 20 gigahertz to 40 gigahertz range). In some embodiments, a lateral dimension 149 of an antenna patch 104 may be less than half of the wavelength of the center frequency to be transmitted/received. In some embodiments, a thickness 122 of the antenna board 100 may be between 500 microns and 2 millimeters (e.g., between 700 microns and 1 millimeter). In some embodiments, the thickness of a metal layer in an antenna feed substrate 102 may be between 5 microns and 50 microns (e.g., between 5 microns and 20 microns, between 10 microns and 20 microns, or approximately 15 microns). In some embodiments, the thickness of a dielectric material between adjacent metal layers in an antenna feed substrate 102 may be between 50 microns and 200 microns (e.g., between 60 microns and 100 microns, between 70 microns and 110 microns, approximately 80 microns, approximately 90 microns, or approximately 100 microns).

Figure 3:
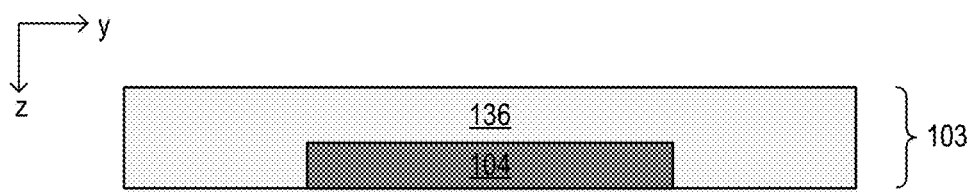
FIGS. 3-16 are side, cross-sectional views of example structures that may be included in an antenna board, in accordance with various embodiments.

FIG. 3 illustrates a stack 103 including a single antenna patch 104 proximate to a bottom face of a support board 136 such that, in an antenna board 100, the antenna patch 104 may be positioned between material of the support board 136 and an antenna feed substrate 102 (not shown). A support board 136 may have any suitable structure; for example, in some embodiments, a support board 136 may be a PCB, or a non-conductive plastic structure. In some embodiments, the antenna patch 104 may be a conductive (e.g., metal) layer in the support board 136. In some embodiments, the antenna patch 104 may be surface mounted (e.g., via solder), glued, laminated, or otherwise coupled to a bottom face of the support board 136. The stack 103 of FIG. 3 may be an example of the stack 103 of FIG. 2: one in which the permittivity regions 106-5 and 106-6, and the antenna patch 104-2, are not present, and in which the permittivity region 106-4 is provided by the material of the support board 136 above the antenna patch 104.

Figure 4:

FIG. 4 illustrates a stack 103 including a single antenna patch 104 proximate to a bottom face of a support board 136 and further includes a recess 113 in the top face of the support board 136 such that the top face of the antenna patch 104 is exposed. In some embodiments, the antenna patch 104 may be a conductive (e.g., metal) layer in the support board 136. The stack 103 of FIG. 4 may be formed by manufacturing the stack 103 of FIG. 3, and then milling, drilling, or otherwise removing material of the support board 136 to expose a top face of the antenna patch 104, or by removing material of the support board 136 to form the recess 113 before coupling the antenna patch 104 to the support board 136. The stack 103 of FIG. 3 may be an example of the stack 103 of FIG. 2: one in which the permittivity regions 106-4, 106-5, and 106-6, and the antenna patch 104-2, are not present.

Figure 5:
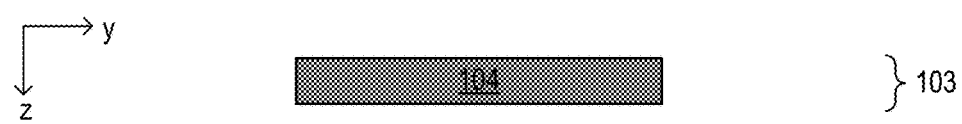

FIG. 5 illustrates a stack 103 including a single antenna patch 104. In some embodiments, the antenna patch 104 may be surface mounted, glued, laminated, or otherwise coupled to a top face of an antenna feed substrate 102. The stack 103 of FIG. 5 may be an example of the stack 103 of FIG. 2: one in which the permittivity regions 106-4, 106-5, and 106-6, and the antenna patch 104-2, are not present.

Figure 6:
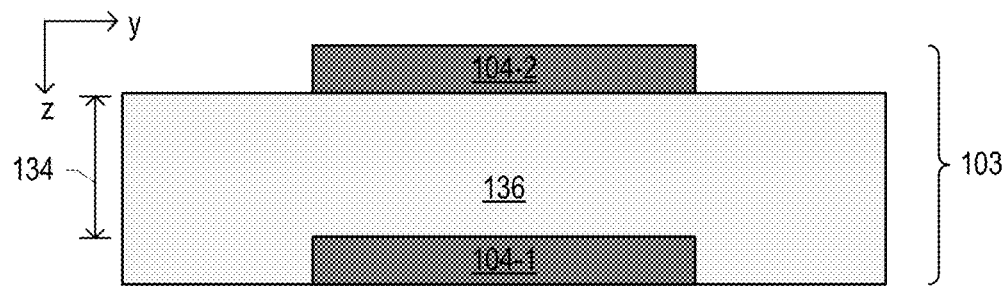

FIG. 6 illustrates a stack 103 including an antenna patch 104-1 proximate to a bottom face of a support board 136 such that, in an antenna board 100, the antenna patch 104-1 may be positioned between material of the support board 136 and an antenna feed substrate 102 (not shown). The stack 103 also includes an antenna patch 104-2 proximate to a top face of the support board 136. In some embodiments, the antenna patch 104-1 and/or the antenna patch 104-2 may be a conductive (e.g., metal) layer in the support board 136. In some embodiments, the antenna patch 104-1 (and/or the antenna patch 104-2) may be surface mounted, glued, laminated, or otherwise coupled to a bottom face (top face) of the support board 136. The stack 103 of FIG. 3 may be an example of the stack 103 of FIG. 2: one in which the permittivity regions 106-5 and 106-6 are not present, and in which the permittivity region 106-4 is provided by the material of the support board 136 between the antenna patches 104-1 and 104-2. In some embodiments, the distance 134 between the antenna patch 104-1 and the antenna patch 104-2 in a stack 103 may be between 50 microns and 200 microns (e.g., between 100 microns and 150 microns, or approximately 120 microns).

Figure 7:
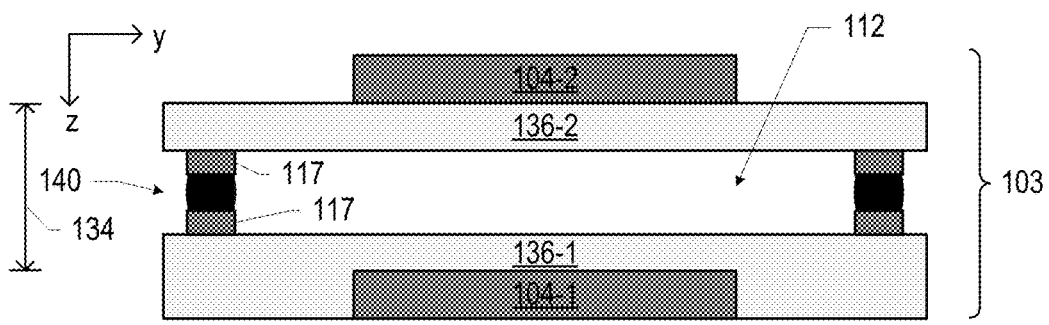

FIG. 7 illustrates a stack 103 including an antenna patch 104-1 proximate to a bottom face of a support board 136-1 such that, in an antenna board 10, the antenna patch 104-1 may be positioned between material of the support board 136-1 and an antenna feed substrate 102 (not shown). The stack 103 also includes an antenna patch 104-2 proximate to a top face of a support board 136-2; the support boards 136 of FIG. 7 may each include conductive contacts 117, and these conductive contacts 117 may be coupled together by solder 140, forming an air cavity 112 between the antenna patches 104-1 and 104-2. In embodiments in which solder is present, other materials, such as a solder resist, may be present but are not shown. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket). The antenna patches 104-1 and 104-2 may be coupled to (e.g., glued, soldered, embedded in, or printed on) the support boards 136-1 and 136-2, respectively. In some embodiments, the conductive contacts 117/solder 140 may provide an electrically conductive material pathway through which signals may be transmitted to or from the antenna patch 104-2. In other embodiments, the conductive contacts 117/solder 140 may be used only for mechanical coupling between the antenna patches 104. The height of the solder 140 and the thicknesses of the support boards 136 may control the distance between the antenna patches 104-1 and 104-2. The height of the solder 140 may be controlled with high accuracy (e.g., between 100 microns and 500 microns). The stack 103 of FIG. 7 may be an example of the stack 103 of FIG. 2: one in which the permittivity region 106-4 is provided by the material of the support board 136-1, the permittivity region 106-5 is provided by the air cavity 112, and the permittivity region 106-6 is provided by the material of the support board 136-2.

Figure 8:
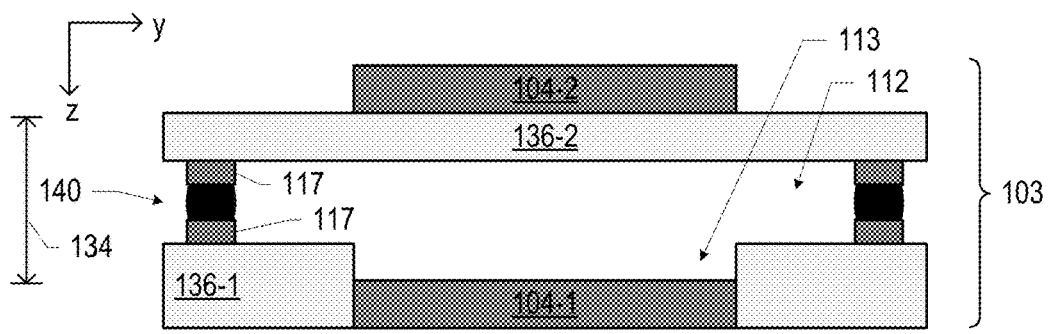

FIG. 8 illustrates a stack 103 similar to that of FIG. 7, but in which the support board 136-1 also includes a recess 113, as discussed above with reference to FIG. 4. The stack 103 of FIG. 8 may be an example of the stack 103 of FIG. 2: one in which the permittivity region 106-4 is not present, the permittivity region 106-5 is provided by the air cavity 112, and the permittivity region 106-6 is provided by the material of the support board 136-2. Although not shown in some others of the accompanying figures, any of the support boards 136-1 disclosed herein may include such a recess 113 (e.g., the support board 136-1 of FIG. 9).

Figure 9:
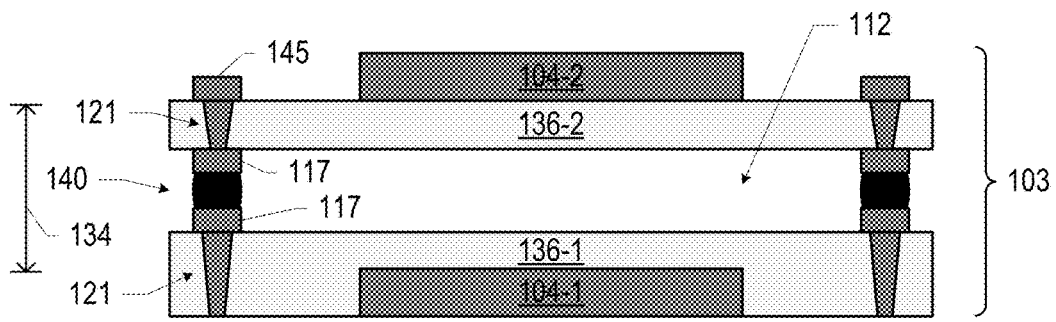

FIG. 9 illustrates a stack 103 similar to that of FIG. 8, but in which the support board 136-1 includes conductive structures 121 (e.g., vias and/or lines, or conductive pillars) electrically coupled to the conductive contacts 117 on the support board 136 to provide an electrical shield (e.g., a Faraday cage) around the antenna patch 104-1. Similarly, the support board 136-2 may include conductive structures 121 and a conductive ring 145 on the top face of the support board 136-2 to provide an electrical shield around the antenna patch 104-2. Together, the conductive structures 121, the conductive contacts 117/solder 140, and the conductive ring 145 provide an electrical shield for the stack 103. Although not shown in some others of the accompanying figures, any of the stacks 103 may include such an electrical shield (e.g., the stack 103 of FIG. 6). A number of electrical shield structures are disclosed herein; by enclosing various elements of the antenna boards 100 therein, these shields may reduce surface waves that cause undesirable coupling and degrade the impedance bandwidth of the antenna and increase the reflection level during beamforming, improving performance. Surface waves may also be responsible for side lobes and null angle limits in beam steering, and thus mitigating surface waves may improve these properties. For example, for boresight radiation antennas, the null angle limits are the angles at which the active scattering parameters (S11) of the antenna array start to degrade quickly due to the high input impedance seen by the feed structures of the antennas in the array; suppressing surface waves for such antennas may benefit the antenna impedance bandwidth in an active scanning array and may enable a wider scanning angle for the array.

Figure 10:
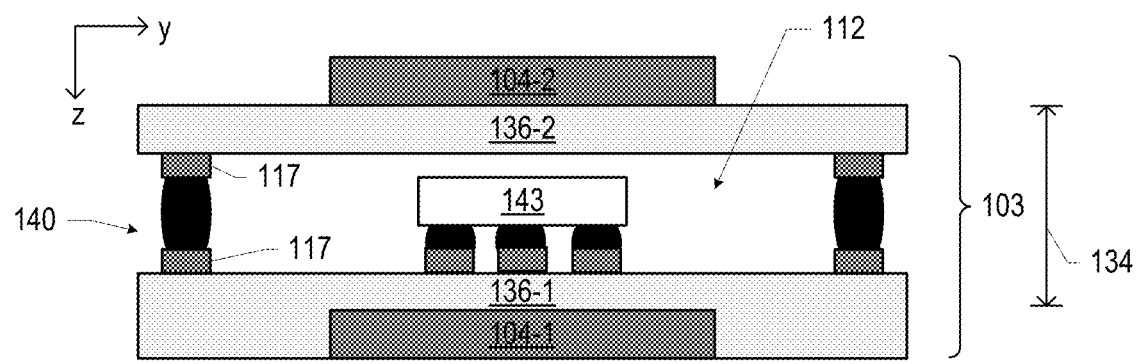

In some embodiments in which a stack 103 includes an air cavity 112, one or more components may be disposed in the air cavity 112. For example, FIG. 10 illustrates a stack 103 similar to that of FIG. 7, but in which a component 143 is mounted to the top face of the support board 136-1 in the air cavity 112. The component 143 may include any suitable passive or active devices, such as a die, a switch, an amplifier, an inductor, a varactor and/or a capacitor. The support board 136-1 may include conductive pathways (including, e.g., vias and/or lines, or conductive pillars, not shown) through which electrical signals may be provided to/from the component 143. In some embodiments, this component 143 may be used to tune the feed structure 118 and/or the antenna patches 104; control lines may run through the support board 136-1 to adjust the electrical characteristics of the component 143 to achieve desired matching or other properties. In other embodiments, one or more components 143 may be mounted to the bottom face of the support board 136-2 in the air cavity 112 (instead of or in addition to components 143 mounted to the top face of the support board 136-1); in such embodiments, the support board 136-2 may include conductive pathways through which electrical signals may be provided to/from the component 143, and the support board 136-2 may be coupled to the support board 136-1 by conductive pathways (e.g., including conductive contacts 117 and solder 140) that allow signals to be transmitted to/from the component 143 through the support board 136-1. A component 143 may be present in an air cavity 112 in any of the stacks 103 disclosed herein. In some embodiments, the component 143 may be wire-bonded, flip-chipped, packaged, embedded, or otherwise coupled to the support board 136-1.

Figure 11:
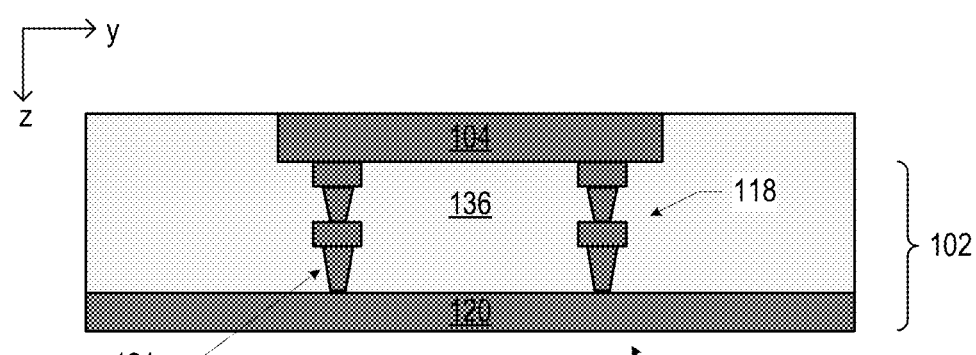

FIG. 11 illustrates an antenna feed substrate 102 and an antenna patch 104 (which may be the antenna patch 104-1 in embodiments in which the stack 103 includes multiple antenna patches 104) proximate to a top face of a support board 136. Generally, a feed structure 118 in an antenna board 100 may extend from the bottom face 110 of an antenna feed substrate 102 into the interior of the antenna feed substrate 102; the feed structure 118 may be driven by electromagnetic signals during operation. In the embodiment of FIG. 11, the feed structures 118 are conductive structures 121 in the support board 136 that provide a continuous material pathway between the antenna patch 104 and the ground plane 120; this arrangement may be referred to as a "direct feed" arrangement. The antenna feed substrate 102 of FIG. 11 may be an example of the antenna feed substrate 102 of FIG. 2: one in which the permittivity regions 106-2 and 106-3 are not present, and the permittivity region 106-1 is provided by the support board 136.

Figure 12:
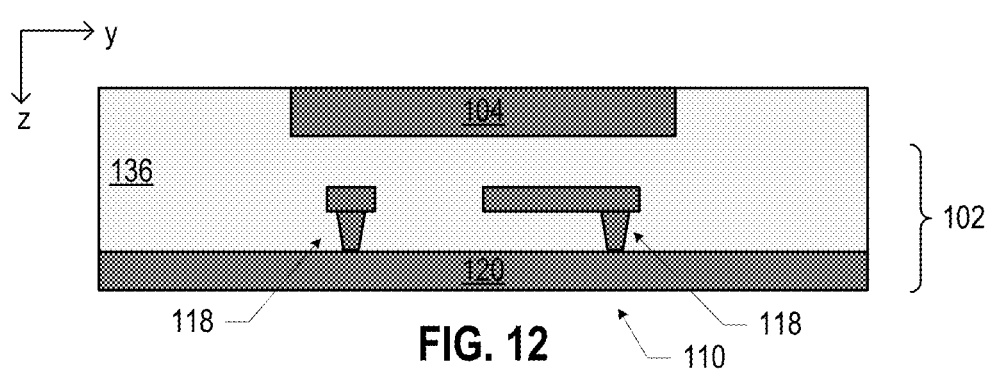

FIG. 12 illustrates an antenna feed substrate 102 and an antenna patch 104 (which may be the antenna patch 104-1 in embodiments in which the stack 103 includes multiple antenna patches 104) proximate to a top face of a support board 136. In the embodiment of FIG. 12, the feed structures 118 are conductive structures 121 in the support board 136 that do not provide a continuous material pathway between the antenna patch 104 and the ground plane 120; this arrangement may be referred to as a "proximate feed" or "indirect feed" arrangement. In particular, the feed structures 118 illustrated in FIG. 12 are examples of L-type feed structures, discussed in further detail below. More generally, a number of examples of proximate feed structures 118 are discussed below, and any such feed structure 118 may be included in the antenna feed substrate 102 of FIG. 12. The antenna feed substrate 102 of FIG. 12 may be an example of the antenna feed substrate 102 of FIG. 2: one in which the permittivity regions 106-2 and 106-3 are not present, and the permittivity region 106-1 is provided by the support board 136.

Figure 13:
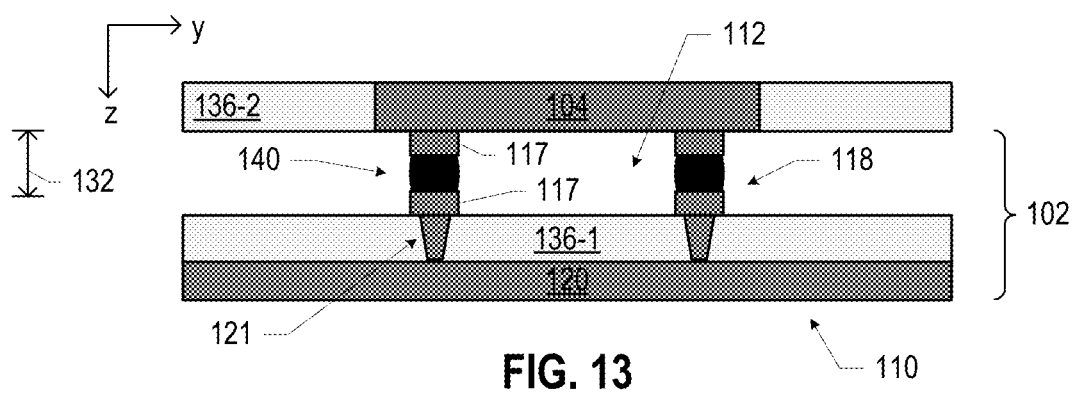

FIG. 13 illustrates an antenna feed substrate 102 and an antenna patch 104 (which may be the antenna patch 104-1 in embodiments in which the stack 103 includes multiple antenna patches 104) coupled to or included in a support board 136-2. The support board 136-2 is coupled to a support board 136-1 by conductive contacts 117/solder 140, as discussed above, forming an air cavity 112 under the antenna patch 104. Further, the conductive contacts 112/solder 140, as well as conductive structures 121 in the support board 136-1, may provide direct feed structures 118 between the ground plane 120 and the antenna patch 104. In particular, the solder 140 may help provide an impedance-controlled connection between the antenna patch 104 and the ground plane 120 to achieve a desired impedance of the feed structures 118. The antenna feed substrate 102 of FIG. 13 may be an example of the antenna feed substrate 102 of FIG. 2: one in which the permittivity region 106-1 is provided by the support board 136-1, the permittivity region 106-2 is provided by the air cavity 112, and the permittivity region 106-3 is absent. In some embodiments, the distance 132 between the top face of the support board 136-1 and the antenna patch 104 (equal to the height of the air cavity 112 in the embodiment of FIG. 13) may be between 75 microns and 200 microns (e.g., between 100 microns and 150 microns, or approximately 120 microns).

Figure 14:
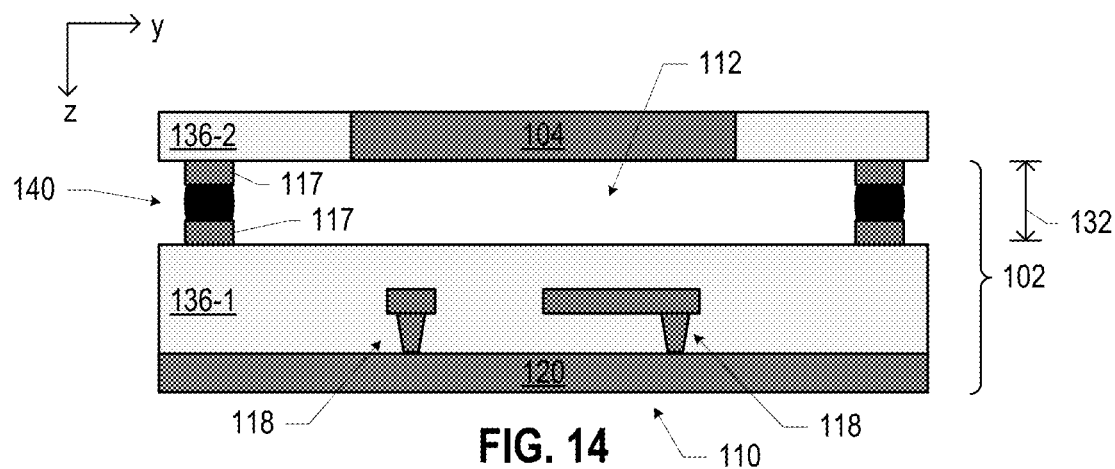

FIG. 14 illustrates an antenna feed substrate 102 and an antenna patch 104 (which may be the antenna patch 104-1 in embodiments in which the stack 103 includes multiple antenna patches 104) coupled to or included in a support board 136-2. The support board 136-2 is coupled to a support board 136-1 by conductive contacts 117/solder 140, as discussed above, forming an air cavity 112 under the antenna patch 104. Proximate feed structures 118 are included in the support board 136-1; these proximate feed structures 118 may take any suitable form (e.g., any of the forms disclosed herein). In particular, the feed structures 118 illustrated in FIG. 14 are examples of L-type feed structures, discussed in further detail below. The antenna feed substrate 102 of FIG. 14 may be an example of the antenna feed substrate 102 of FIG. 2: one in which the permittivity region 106-1 is provided by the support board 136-1, the permittivity region 106-2 is provided by the air cavity 112, and the permittivity region 106-3 is absent.

Figure 15:
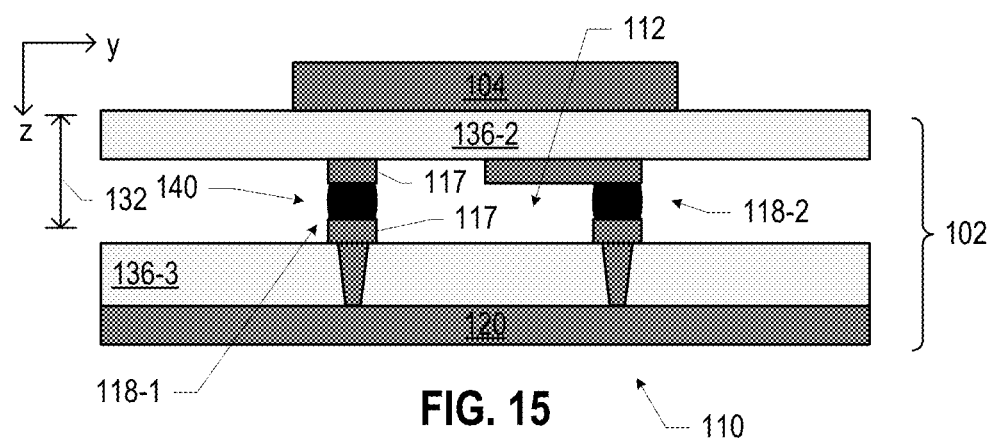

FIG. 15 illustrates an antenna feed substrate 102 and an antenna patch 104 (which may be the antenna patch 104-1 in embodiments in which the stack 103 includes multiple antenna patches 104) coupled to or included in a support board 136-2. The support board 136-2 is coupled to a support board 136-1 by conductive contacts 117/solder 140, as discussed above, forming an air cavity 112 under the antenna patch 104. The conductive contacts 117/solder 140, and conductive structures 121 in the support board 136-1, may together be part of proximate feed structures 118; these proximate feed structures 118 may take any suitable form (e.g., any of the forms disclosed herein). In particular, the feed structures 118 illustrated in FIG. 15 are examples of L-type feed structures, discussed in further detail below. The air cavity 112 may extend around at least a portion of the proximate feed structures 118, and the support board 136-2 may separate the antenna patch 104 from the proximate feed structures 118. The antenna feed substrate 102 of FIG. 15 may be an example of the antenna feed substrate 102 of FIG. 2: one in which the permittivity region 106-1 is provided by the support board 136-1, the permittivity region 106-2 is provided by the air cavity 112, and the permittivity region 106-3 is provided by the support board 136-1.

Figure 16:
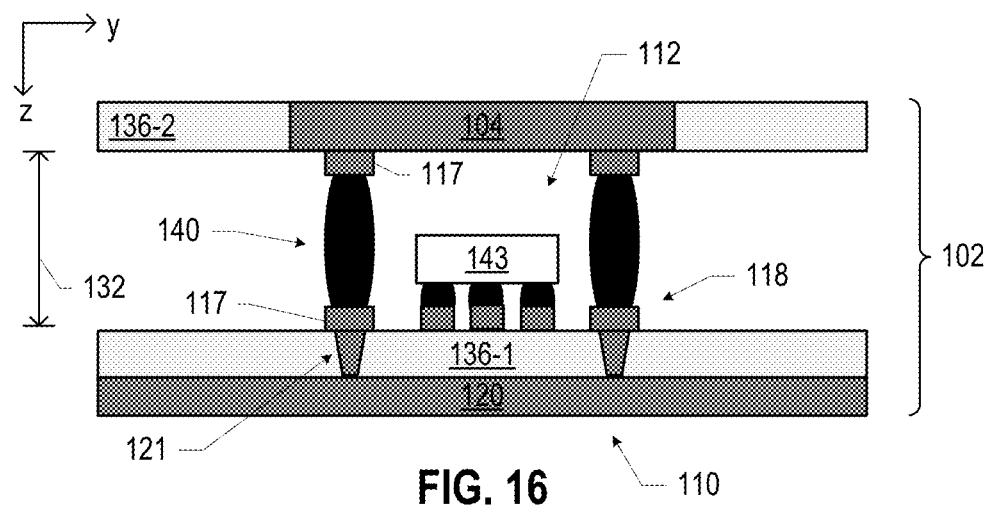

In some embodiments in which an antenna feed substrate 102 includes an air cavity 112, one or more components may be disposed in the air cavity 112. For example, FIG. 16 illustrates an antenna feed substrate 102 similar to that of FIG. 13, but in which a component 143 is mounted to the top face of the support board 136-1 in the air cavity 112. The support board 136-1 may include conductive pathways (including, e.g., vias and/or lines, or conductive pillars, not shown) through which electrical signals may be provided to/from the component 143. In other embodiments, one or more components 143 may be mounted to the bottom face of the support board 136-2 in the air cavity 112 (instead of or in addition to components 143 mounted to the top face of the support board 136-1); in such embodiments, the support board 136-2 may include conductive pathways through which electrical signals may be provided to/from the component 143, and the support board 136-2 may be coupled to the support board 136-1 by conductive pathways (e.g., including conductive contacts 117 and solder 140) that allow signals to be transmitted to/from the component 143 through the support board 136-1. A component 143 may be present in an air cavity 112 in any of the antenna feed substrates 102 disclosed herein. Any of the components 143 discussed above may be included in antenna feed substrate 102.

Figure 17A:
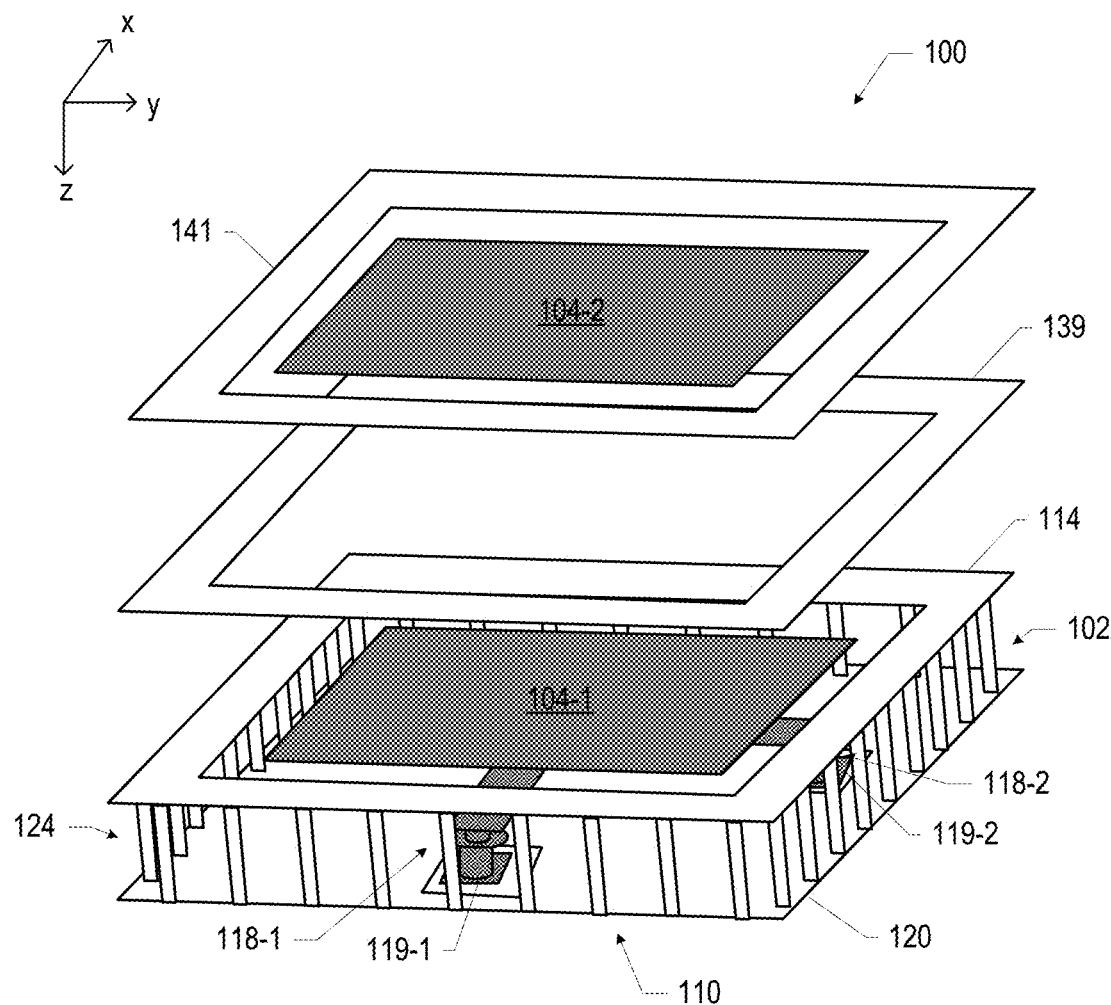
FIGS. 17A and 17B are various views of an example structure that may be included in an antenna board, in accordance with various embodiments.
Figure 17B:
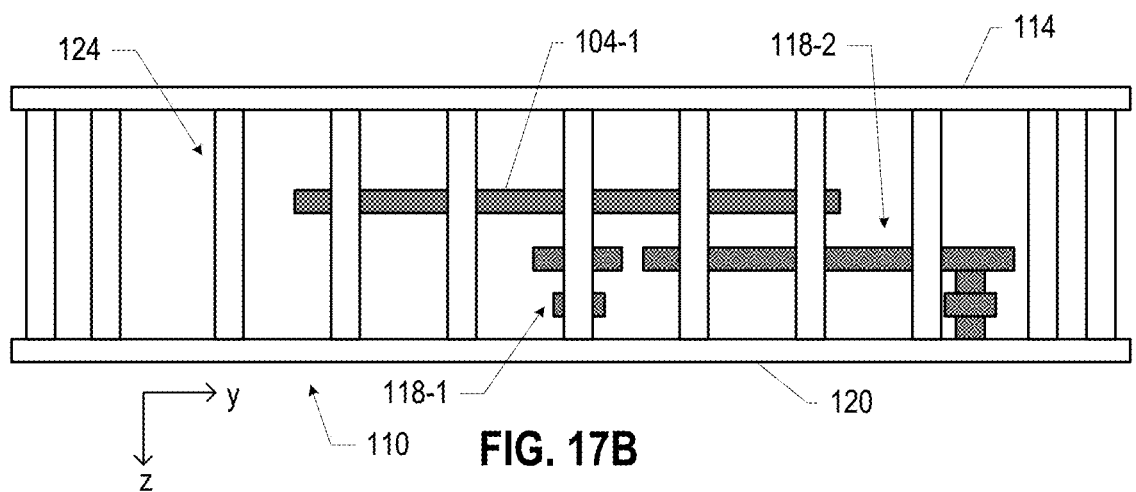

As discussed above with reference to FIG. 9, any of the antenna boards 100 disclosed herein may include conductive structures to provide an electromagnetic shield around the antenna patch(es) 104, the feed structures 118, and/or other components of the antenna boards 100. For example, FIGS. 17A and 17B are various views of some example components in an antenna board 100, in accordance with various embodiments. FIG. 17A is an exploded perspective view (with some components omitted for ease of illustration) and FIG. 17B is a side, cross-sectional view of the bottom portion of the structure of FIG. 17A.

The antenna board 100 of FIG. 17 may include a ground plane 120 at the bottom face 110, and one or more feed structures 118 extending from the ground plane 120 into the antenna feed substrate 102. Pads 119 (e.g., 119-1 of feed structure 118-1, 119-2 of feed structure 118-2) of the feed structures 118 may be coplanar with the ground plane 120. Shield posts 124, which may include one or more vias or conductive pillars in the antenna feed substrate 102, may be disposed proximate to the edges of the antenna feed substrate 102 and may electrically couple a ground ring 114 to the ground plane 120 to provide a Faraday cage around the feed structure 118. The ground rings disclosed herein may reduce return losses relative to embodiments in which ground rings are absent. Proximate feed structures 118 (like the ones illustrated in FIGS. 12, 14, and 15) are depicted in FIG. 17, but any suitable feed structures 118 may be used in an antenna board 100 like the one illustrated in FIG. 17. In particular, the feed structures 118 illustrated in FIG. 17 are examples of L-type feed structures, discussed in further detail below. The antenna patch 104-1 may be disposed "within" the region surrounded by the shield posts 124. Another ground ring 141 may surround the antenna patch 104-2, and an additional ground ring 139 may be disposed between the ground ring 141 and the ground ring 114.

Figure 18:
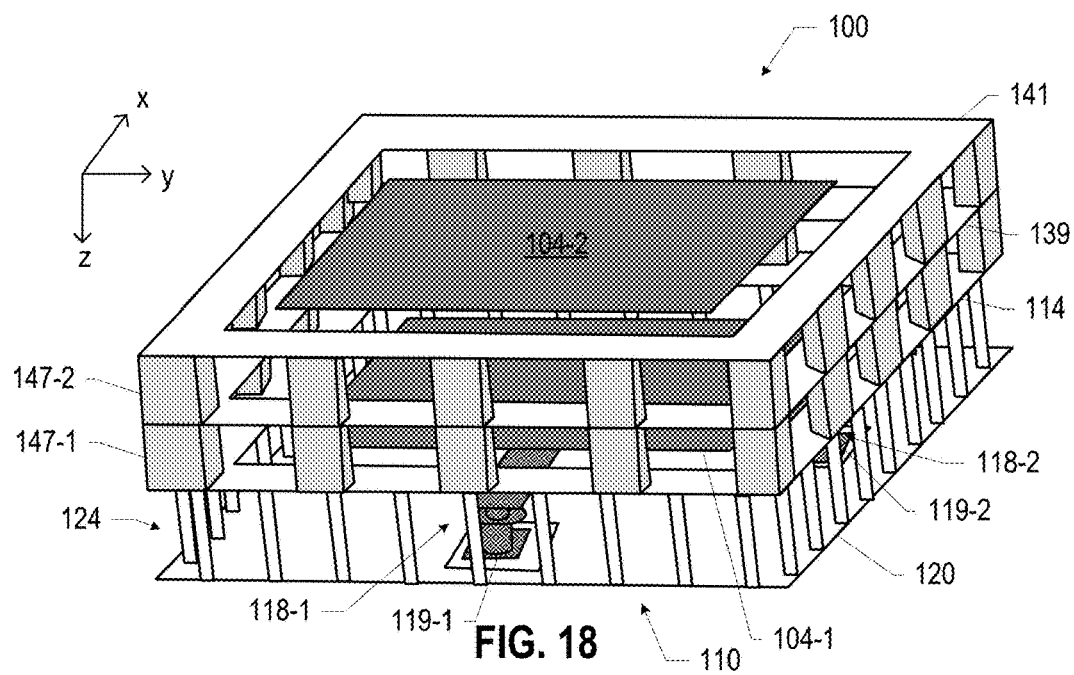
FIG. 18 is a perspective view of an example structure that may be included in an antenna board, in accordance with various embodiments.

The ground rings 114, 139, and 141 may be coupled together in any suitable manner. FIG. 18 illustrates an embodiment of the antenna board 100 of FIG. 17 in which the ground ring 114 is coupled to the ground ring 139 by conductive structures 147-1, and the ground ring 139 is coupled to the ground ring 141 by conductive structures 147-2. The conductive structures 147-1 may include lines, vias, and/or conductive pillars (e.g., when a solid dielectric material is disposed between the ground ring 114 and the ground ring 139) or conductive contacts 117/solder 140 (e.g., when an air cavity is desired between the ground ring 114 and the ground ring 139). Similarly, the conductive structures 147-2 may include lines, vias, and/or conductive pillars (e.g., when a solid dielectric material is disposed between the ground ring 139 and the ground ring 141) or conductive contacts 117/solder 140 (e.g., when an air cavity is desired between the ground ring 139 and the ground ring 141).

As noted above, any suitable feed structures 118 may be included in an antenna board 100. FIGS. 19 and 20 illustrate two examples of proximate feed structures 118: L-type feed structures 118, and H-type feed structures 118, respectively. The L-type and H-type feed structures 118 disclosed herein may enable the impedance bandwidth to be tuned and broadened for improved performance (e.g., for millimeter wave communication). The feed structures 118 disclosed herein may be readily tuned for different environments by adjusting the impedance (e.g., through dimensions of the feed structures 118, or supporting elements, like the components 143 discussed above).

Figure 19A:
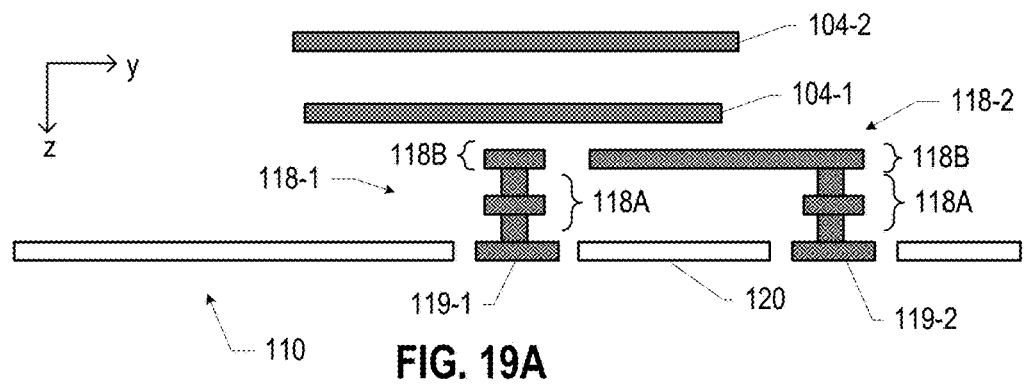
FIGS. 19A and 19B are various views of an example structure that may be included in an antenna board, in accordance with various embodiments.
Figure 19B:
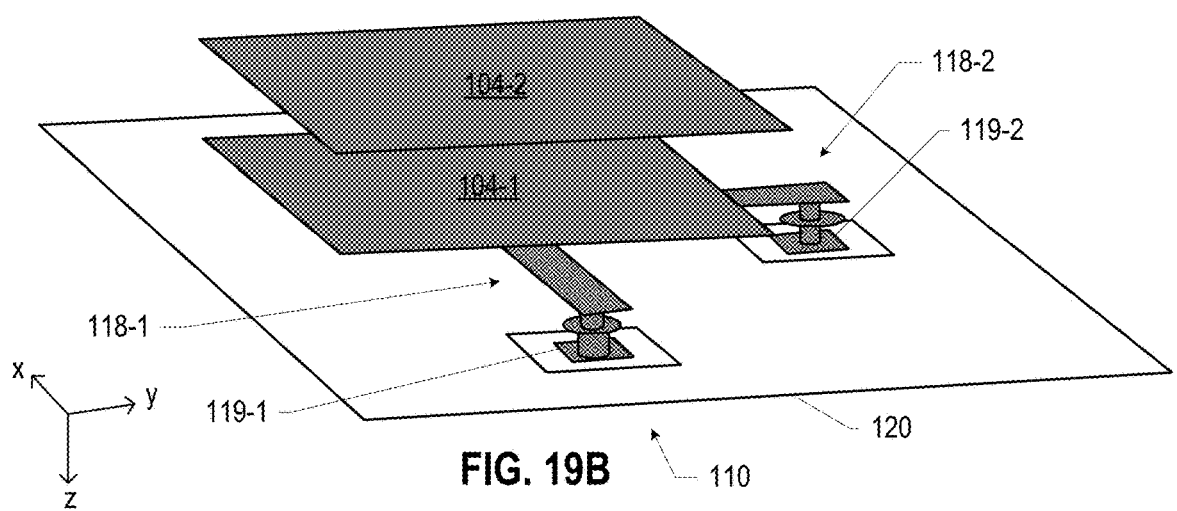

FIG. 19 illustrates some of the conductive structures that may be included in an antenna board 100, including two antenna patches 104-1 and 104-2, and two L-type feed structures 118-1 and 118-2 extending from a ground plane 120 towards the antenna patches 104. The term "L-type" is used due to the similarity of the shape of an L-type feed structure 118 to an uppercase letter "L." FIG. 19A is a side, cross-sectional view, and FIG. 19B is a perspective view. In some antenna boards 100, the embodiment of FIG. 19 may be implemented in a structure like that of FIG. 17, the antenna patches 104 may be arranged in any of the manners discussed above with reference to the stacks 103 of FIGS. 6-10, and/or the feed structures 118 and ground plane 120 may be arranged in any of the manners discussed above with reference to the antenna feed substrates 102 of FIG. 12, 14, or 15.

The L-type feed structures 118 include a vertical portion 118A extending perpendicular to the ground plane 120 from a pad 119 (e.g., 119-1 of feed structure 118-1, 119-2 of feed structure 118-2), and a horizontal portion 118B extending parallel to (and spaced away from) the ground plane 120. Two L-type feed structures 118 included in an antenna board 100 may have their horizontal portions 118B oriented perpendicular to each other, as shown in FIG. 19, to achieve two orthogonal polarizations. During use, the horizontal portion 118B and the antenna patches 104 may be capacitively coupled, and the vertical portion 118A may act as an inductor between the horizontal portion 118B and the ground plane 120. The dimensions of the L-type feed structures 118 may be selected to achieve a desired electromagnetic interaction with the antenna patches 104. For example, the location along a horizontal portion of a feed structure 118 at which a vertical portion makes contact may be adjusted to achieve a desired impedance (or other parameters). In FIG. 19, the L-type feed structures are shown as including a specific number of vias, lines, and pads, but this is simply illustrative, and any suitable number and arrangement of structures (e.g., conductive pillars) may be used. For example, as illustrated in FIG. 15, some or all of the vertical portion 118A of an L-type feed structure 118 may be provided by solder 140 (e.g., controlled to a desired height to achieve one or more air cavities 112).

Figure 20A:
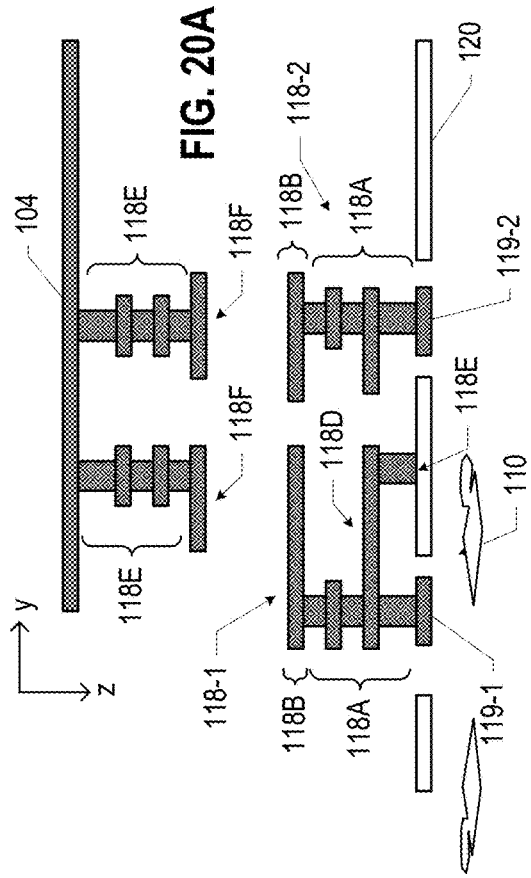
FIGS. 20A and 20B are various views of an example structure that may be included in an antenna board, in accordance with various embodiments.
Figure 20B:
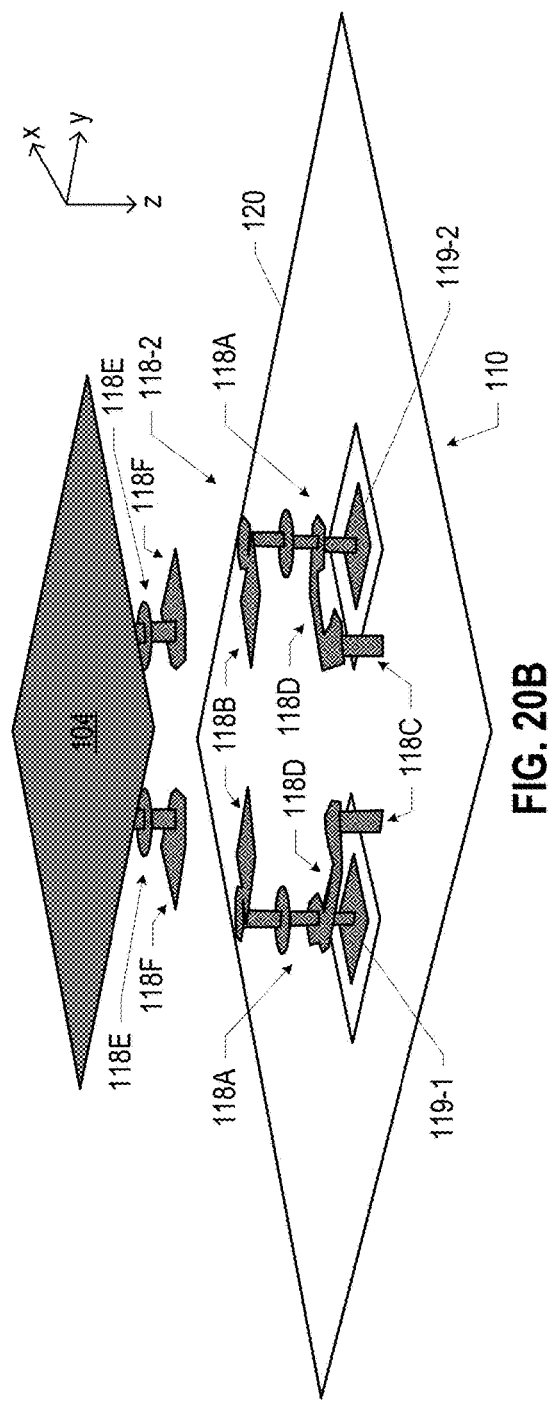

FIG. 20 illustrates some of the conductive structures that may be included in an antenna board 100, including an antenna patch 104 and two H-type feed structures 118-1 and 118-2 extending from a ground plane 120 towards the antenna patch 104. The term "H-type" Is used due to the similarity of the shape of an H-type feed structure 118 to a lowercase letter "H." FIG. 20A is a side, cross-sectional view, and FIG. 20B is a perspective view. In some antenna boards 100, the embodiment of FIG. 20 may be implemented in a structure like that of FIG. 17, the antenna patch 104 may be arranged in any of the manners discussed above with reference to the stacks 103 of FIGS. 3-5, and/or the feed structures 118 and ground plane 120 may be arranged in any of the manners discussed above with reference to the antenna feed substrates 102 of FIG. 12, 14, or 15. Further, additional antenna patches 104 may be included in the structure of FIG. 20 "above" the antenna patch 104 (e.g., in accordance with any of the embodiments of the stack 103 discussed above with reference to FIGS. 6-10).

The H-type feed structures 118 illustrated in FIG. 20 may use half-wave antenna elements, and in some embodiments, may be matched without the use of other discrete components; in other embodiments, dipole elements or quarter-wave elements (e.g., a monopole antenna) may be used. The H-type feed structures 118 include a first vertical portion 118A extending perpendicular to the ground plane 120 from a pad 119 (e.g., 119-1 of feed structure 118-1, 119-2 of feed structure 118-2), a first horizontal portion 118B extending parallel to (and spaced away from) the ground plane 120, a second vertical portion 118C extending perpendicular to the ground plane 120, and a second horizontal portion 118D extending parallel to (and spaced away from) the ground plane 120. The first vertical portion may extend between the pad 119 (e.g., 119-1 of feed structure 118-1, 119-2 of feed structure 118-2) and the second horizontal portion 118D (and also contacting the first horizontal portion 118B), and the second vertical portion 118C may extend between the first horizontal portion 118B and the ground plane 120. The first horizontal portion 118B may be between the second horizontal portion 118D and the ground plane 120. The horizontal portions 118B and 118D may have any suitable shapes, such as the shapes illustrated in FIG. 20B. Two H-type feed structures 118 included in an antenna board 100 may have their first horizontal portions 118B oriented perpendicular to each other, as shown in FIG. 20, to achieve two orthogonal polarizations; similarly, two H-type feed structures 118 included in an antenna board 100 may have their second horizontal portions 118D oriented perpendicular to each other, as shown in FIG. 20.

The H-type feed structures 118 of FIG. 20 also include a third vertical portion 118E and a third horizontal portion 118F. The third vertical portion 118E is in electrical contact with the antenna patch 104 and extends perpendicular to the antenna patch 104 (and to the ground plane 120), and the third horizontal portion 118F is in contact with the third vertical portion 118E and extends parallel to the antenna patch 104. The third horizontal portion 118E may be above, and spaced away from, the second horizontal portion 118D. The third horizontal portion 118F may have any suitable shape, such as the shape illustrated in FIG. 20B. Together, the third vertical portion 118E and the third horizontal portion 118F may provide a passive element extension of the antenna patch 104; during use, the third horizontal portion 118F and the second horizontal portion 118D may be capacitively coupled, the first vertical portion 118A may act as an inductor between the second horizontal portion 118D and the ground plane 120, and the second vertical portion 118C may act as an inductor that is partially parallel to the inductor of the first vertical portion 118A.

In some embodiments, the H-type feed structures 118 disclosed herein may not include the third vertical portion 118E or the third horizontal portion 118F, but including these portions may improve the quality factor of the antenna patch 104 when the distance between the antenna patch 104 and the ground plane 120 is large or if the quality factor of the antenna patch 104 is otherwise low due to loading from the adjacent environment. Locating the third vertical portion 118E away from the edge of the antenna patch 104 may mitigate the effect that use of the passive element extension may have on the resonance frequency of the antenna patch 104. The impedance of the H-type feed structures 118 may be retuned for different environments (e.g., in a communication device 151 having a glass back cover 176, as discussed below).

In FIG. 20, the H-type feed structures 118 are shown as including a specific number of vias, lines, and pads, but this is simply illustrative, and any suitable number and arrangement of structures (e.g., conductive pillars) may be used. For example, as illustrated in FIG. 15, some or all of the vertical portions 118A, 118C, or 118E of an H-type feed structure 118 may be provided by solder 140 (e.g., controlled to a desired height to achieve one or more air cavitys 112). The dimensions of the H-type feed structures 118 may be selected to achieve a desired electromagnetic interaction with the antenna patches 104. For example, the areas of the second horizontal portion 118D and the third horizontal portion 118F may be adjusted to achieve a desired size of the resonance curl, the area of the antenna patch 104 may be adjusted to achieve a desired absolute resonance frequency, the height of the first vertical portion 118A may be adjusted to achieve a desired position of the resonance curl in a Smith chart, and the size and position of the second vertical portion 118C may be adjusted to achieve a desired match of the resonance curl to a target impedance (e.g., to achieve a desired impedance bandwidth).

Figure 21A:
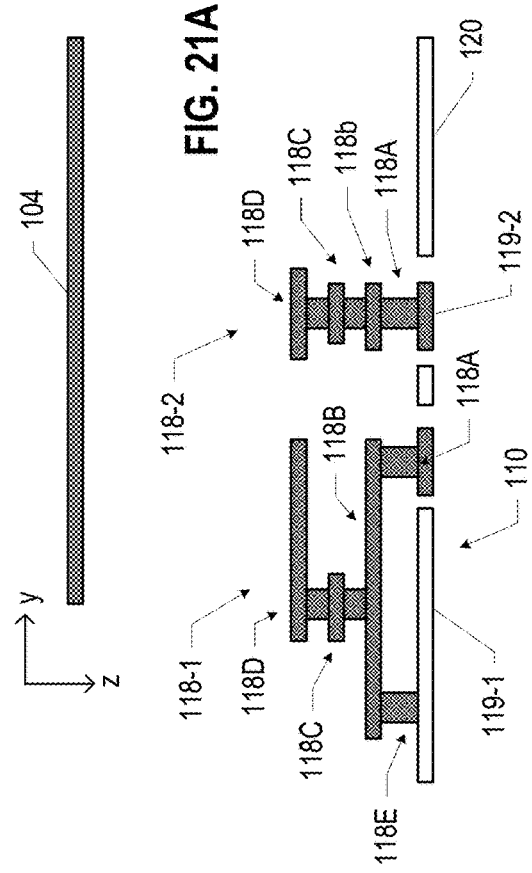
FIGS. 21A and 21B are various views of an example structure that may be included in an antenna board, in accordance with various embodiments.
Figure 21B:
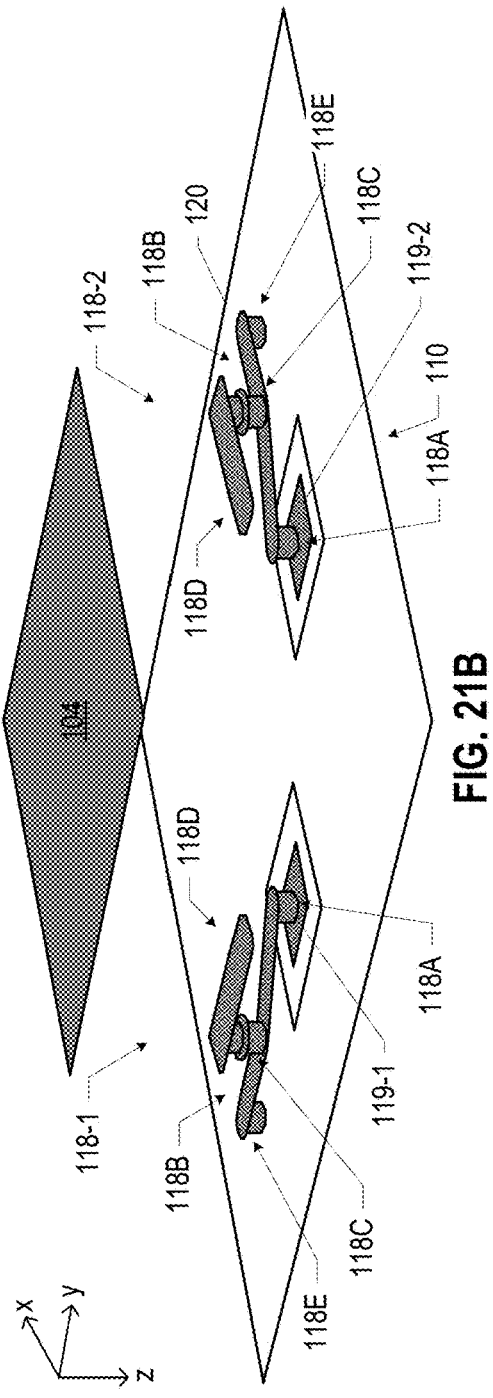

FIG. 21 illustrates some of the conductive structures that may be included in an antenna board 100, including an antenna patch 104 and two other H-type feed structures 118-1 and 118-2 extending from a ground plane 120 towards the antenna patch 104. FIG. 21A is a side, cross-sectional view, and FIG. 21B is a perspective view. In some antenna boards 100, the embodiment of FIG. 21 may be implemented in a structure like that of FIG. 17, the antenna patch 104 may be arranged in any of the manners discussed above with reference to the stacks 103 of FIGS. 3-5, and/or the feed structures 118 and ground plane 120 may be arranged in any of the manners discussed above with reference to the antenna feed substrates 102 of FIG. 12, 14, or 15. Further, additional antenna patches 104 may be included in the structure of FIG. 21 "above" the antenna patch 104 (e.g., in accordance with any of the embodiments of the stack 103 discussed above with reference to FIGS. 6-10).

The H-type feed structures 118 of FIG. 21 include a first vertical portion 118A extending perpendicular to the ground plane 120 from a pad 119 (e.g., 119-1 of feed structure 118-1, 119-2 of feed structure 118-2), a first horizontal portion 118B extending parallel to (and spaced away from) the ground plane 120, a second vertical portion 118C extending from the first horizontal portion 118B perpendicular to the ground plane 120, a second horizontal portion 118D extending parallel to (and spaced away from) the ground plane 120, and a third vertical portion 118E extending between the ground plane 120 and the first horizontal portion 118B. The first vertical portion may extend between the pad 119 (e.g. 119-1 of feed structure 118-1, 119-2 of feed structure 118-2) and the first horizontal portion 118B, and the second vertical portion 118C may extend between the first horizontal portion 118B and the second horizontal portion 118D. The horizontal portions 118B and 118D may have any suitable shapes, such as the shapes illustrated in FIG. 20B. Two H-type feed structures 118 included in an antenna board 100 may have their first horizontal portions 118B oriented substantially perpendicular to each other, as shown in FIG. 21, to achieve two orthogonal polarizations; similarly, two H-type feed structures 118 included in an antenna board 100 may have their second horizontal portions 118D oriented perpendicular to each other, as shown in FIG. 21. The embodiment of FIG. 21 does not include a passive element extension (e.g., as discussed above with reference to FIG. 20), but in some implementations, the H-feed structures 118 of FIG. 21 may be used with a passive element extension.

In FIG. 21, the H-type feed structures 118 are shown as including a specific number of vias, lines, and pads, but this is simply illustrative, and any suitable number and arrangement of structures (e.g., conductive pillars) may be used. For example, as illustrated in FIG. 15, some or all of the vertical portions 118A, 118C, or 118E of an H-type feed structure 118 may be provided by solder 140 (e.g., controlled to a desired height to achieve one or more air cavitys 112). The dimensions of the H-type feed structures 118 may be selected to achieve a desired electromagnetic interaction with the antenna patches 104 (e.g., as discussed above with reference to FIG. 20). Use of the H-type feed structures 118 of FIG. 20 or 21 may achieve a significantly greater impedance bandwidth than conventional approaches (e.g., a tradition single order matched monopole or dipole antenna).

Figure 22:
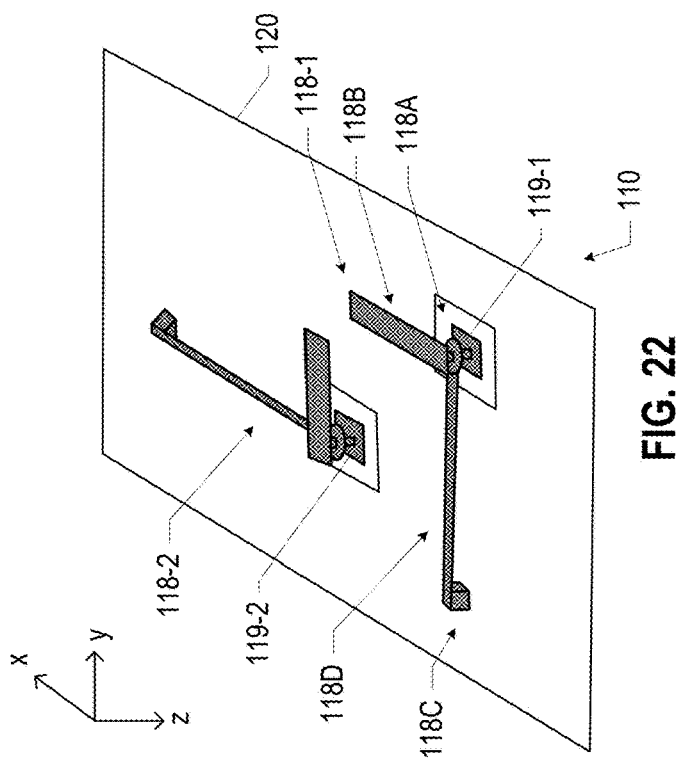
FIG. 22 is a perspective view of an example structure that may be included in an antenna board, in accordance with various embodiments.

Any of the proximate feed structures 118 may be augmented with additional horizontal portions and/or vertical portions to achieve a desired electromagnetic interaction with the antenna patch(es) 104. For example, FIG. 22 illustrates an L-type feed structure 118 (like that discussed above with reference to FIG. 19) that has been augmented with an additional vertical portion 118C and an additional horizontal portion 118D. The additional horizontal portion 118D may contact the vertical portion 118A and may extend perpendicular to the horizontal portion 118B, as shown. The additional vertical portion 118C may electrically couple the additional horizontal portion 118D and the ground plane. The additional horizontal portion 118D may be referred to as a "shorting stub" (and may be, for example, a microstrip stub) and the additional vertical portion 118C may be referred to as a "shorting via" (which may act as a small inductor that resonates out excessive capacitance during operation). Including the additional vertical portion 118O and the additional horizontal portion 118D may improve the relative bandwidth of the feed structure 118, and may maintain good isolation between the two orthogonal polarizations across the operational bandwidth. Additional transmission lines, like the horizontal portion 118D, may be included in any of the feed structures 118 disclosed herein to achieve a matched impedance. As discussed above with reference to FIGS. 19 and 20, the feed structures 118 of FIG. 22 are shown as including a specific number of vias, lines, and pads, but this is simply illustrative, and any suitable number and arrangement of structures (e.g., conductive pillars) may be used. For example, as illustrated in FIG. 15, some or all of the vertical portions 118A or 118O of the feed structure 118 of FIG. 22 may be provided by solder 140 (e.g., controlled to a desired height to achieve one or more air cavitys 112).

An antenna board 100 may include other feed structures 118, and/or one or more different types of feed structures 118. For example, FIG. 23 is a perspective view of some conductive structures in an antenna board 100, including two antenna patches 104-1 and 104-2, and two feed structures 118 associated with each antenna patch 104. The two feed structures 118 associated with the antenna patch 104-1 (feed structures 118-1 and 118-2) are direct feed structures 118, and the two feed structures 118 associated with the antenna patch 104-2 (feed structure 118-3 and another feed structure 118, not visible from the perspective of FIG. 23) are proximate feed structures. Note that, in the embodiment illustrated in FIG. 23, the antenna patch 104-1 is substantially rectangular but with two material "extensions" with which the feed structures 118-1 and 118-2 are in contact; as noted above, any of the antenna patches 104 disclosed herein may include such extensions, as appropriate. The feed structures 118-1 and 118-2 may provide a continuous conductive material pathway between the ground plane 120 and the antenna patch 104-1, and may be oriented at "perpendicular" sides of the antenna patch 104-1 (as shown) to enable two orthogonal polarizations. The feed structure 118-3 (and another feed structure 118, not visible from the perspective of FIG. 23) is a proximate feed structure 118 that includes a vertical portion 118A in contact with a first conductive ring 118G. The feed structure 118-3 may further include a second conductive ring 118H which may be spaced apart from the first conductive ring 118G; the antenna patch 104-2 may be disposed in the interior of the conductive ring 118G. The vertical portions 118A of the visible feed structure 118-3 and the other feed structure 118 associated with the antenna patch 104-2 may have different vertical portions 118A (oriented perpendicular to each other), but may share the first conductive ring 118G and the second conductive ring 118H. In some antenna boards 100, the embodiment of FIG. 23 may be implemented in a structure like that of FIG. 17, the antenna patches 104 may be arranged in any of the manners discussed above with reference to the stacks 103 of FIGS. 6-10, and/or the feed structures 118 and ground plane 120 may be arranged in any of the manners discussed above with reference to the antenna feed substrates 102 of FIG. 12, 14, or 15. The four feed structures 118 in a structure like that of FIG. 23 may be used to achieve two polarizations in each of two frequency bands (e.g., 28 gigahertz and 39 gigahertz).

FIG. 23 is also an example of an embodiment in which two antenna patches 104 in a stack 103 are horizontally offset from each other; although FIG. 23 shows the antenna patches 104 as partially "overlapping," they may be offset further, so as not to be overlapping.

Figure 24:
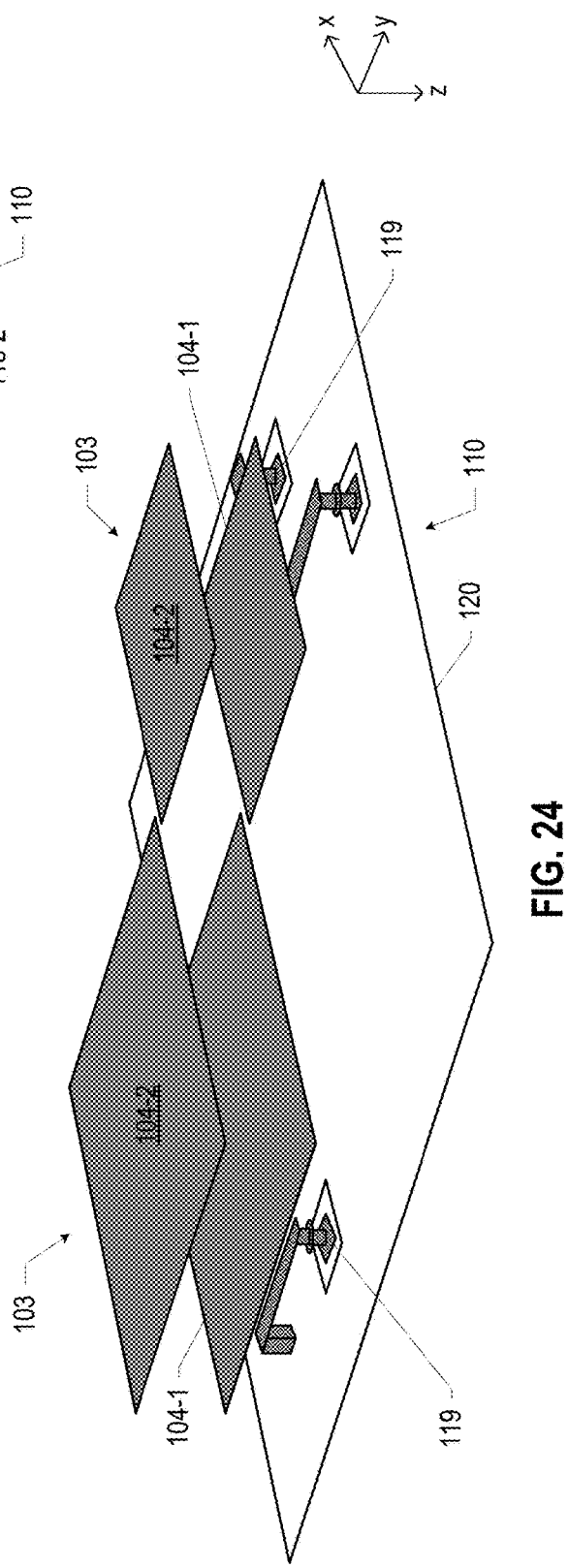

As noted above, an antenna board 100 may include multiple stacks 103. For example, FIG. 24 illustrates two antenna stacks 103 that may be included in a single antenna board 100; these stacks 103 may be offset from each other, and each may have their own feed structures 118 (e.g., in accordance with any of the embodiments disclosed herein).

In some embodiments, one stack 103 may be tuned for high band communications, and the other stack 103 may be tuned for low band communications; these stacks 103 may be included in the same antenna board 100, in some embodiments.

Figure 25:
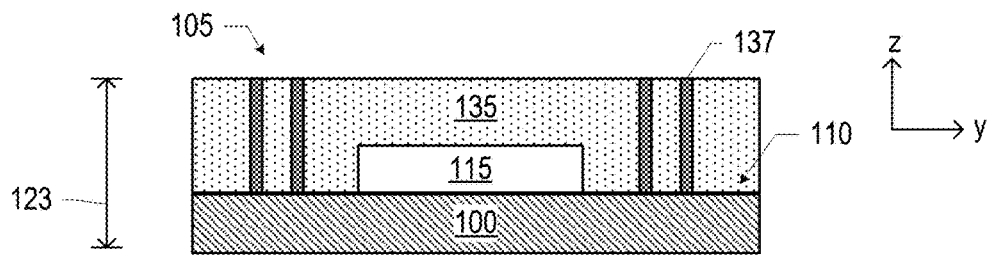
FIG. 25 is a side, cross-sectional view of an example antenna module, in accordance with various embodiments.

In some embodiments, an antenna board 100 may be part of an antenna module. For example, FIG. 25 is a side, cross-sectional view of an antenna module 105, in accordance with various embodiments. The antenna module 105 may include an IC package 115 coupled to an antenna board 100. Although a single IC package 115 is illustrated in FIG. 1, an antenna module 105 may include more than one IC package 115 (and/or more than one antenna board 100, as discussed below with reference to FIG. 27). As noted above, the antenna board 100 may include an antenna feed substrate 102 (not shown in FIG. 25) having conductive pathways (e.g., provided by conductive vias and lines through one or more dielectric materials) and radio frequency (RF) transmission structures (e.g., feed structures 118) that may enable one or more antenna patches 104 (not shown in FIG. 25) to transmit and receive electromagnetic waves under the control of circuitry in the IC package 115. In some embodiments, the IC package 115 may be coupled to the antenna board 100 by second-level interconnects (not shown, but discussed below with reference to FIG. 26). In some embodiments, an antenna module 105 may include a different IC package 115 for controlling each different antenna patch 104 or stack 103; in other embodiments, an antenna module 105 may include one IC package 115 having circuitry to control multiple antenna patches 104 or stacks 103. In some embodiments, the total z-height 123 of an antenna module 105 may be less than 3 millimeters (e.g., between 2 millimeters and 3 millimeters).

In the embodiment of FIG. 25, a mold compound 135 is shown disposed around the IC package 115, and conductive pillars 137 (e.g., copper pillars) extend from the antenna board 100 through the mold compound 135 and are exposed at the top face of the antenna module 105. The conductive pillars 137 may be in contact with conductive contacts on the face of the antenna board 100 (not shown), and the antenna module 105 may be coupled to another component (e.g., a motherboard) at its top face; electrical signals may be transmitted to/from the IC package 115 from such other component via the conductive pillars 137, conductive pathways in the antenna board 100 (not shown), and second-level interconnects (not shown) between the antenna board 100 and the IC package 115.

In some embodiments, an antenna board 100 and/or an antenna module 105 may include one or more arrays of antenna patches 104 to support multiple communication bands (e.g., dual band operation or tri-band operation). For example, some of the antenna boards 100 and/or antenna modules 105 disclosed herein may support tri-band operation at 28 gigahertz, 39 gigahertz, and 60 gigahertz. Various ones of the antenna boards 100 and/or antenna modules 105 disclosed herein may support tri-band operation at 24.5 gigahertz to 29 gigahertz, 37 gigahertz to 43 gigahertz, and 57 gigahertz to 71 gigahertz. Various ones of the antenna boards 100 and/or antenna modules 105 disclosed herein may support 5G communications and 60 gigahertz communications. Various ones of the antenna boards 100 and/or antenna modules 105 disclosed herein may support 28 gigahertz and 39 gigahertz communications. Various of the antenna boards 100 and/or antenna modules 105 disclosed herein may support millimeter wave communications. Various of the antenna boards 10 and/or antenna modules 105 disclosed herein may support high band frequencies and low band frequencies.

Figure 26:
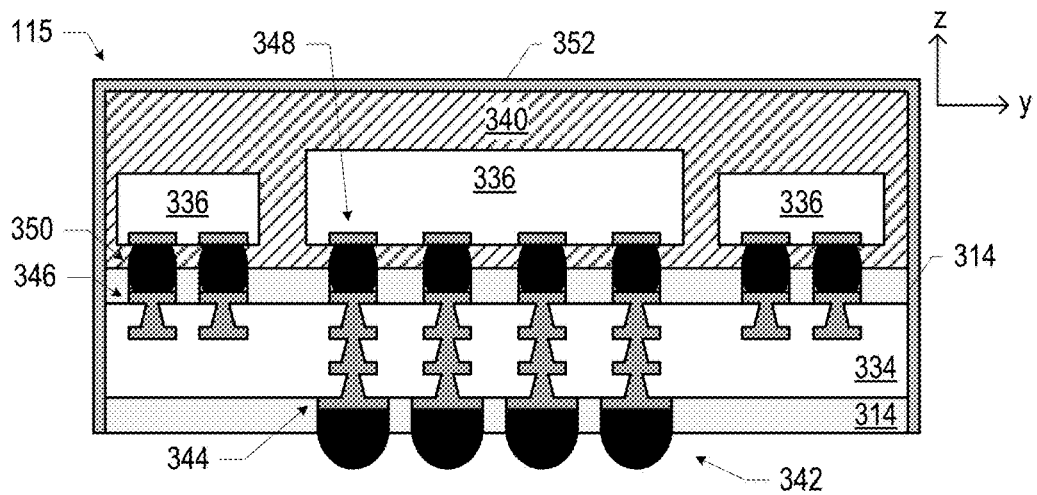
FIG. 26 is a side, cross-sectional view of an example integrated circuit (IC) package that may be included in an antenna module, in accordance with various embodiments.

The IC package 115 included in an antenna module may have any suitable structure. For example, FIG. 26 illustrates an example IC package 115 that may be included in an antenna module 105. The IC package 115 may include a package substrate 334 to which one or more components 336 may be coupled by first-level interconnects 350. In particular, conductive contacts at one face of the package substrate 334 may be coupled to conductive contacts 348 at faces of the components 336 by first-level interconnects 350. The first-level interconnects 350 illustrated in FIG. 26 are solder bumps, but any suitable first-level interconnects 350 may be used. A solder resist 314 may be disposed around the conductive contacts 346. The package substrate 334 may include a dielectric material, and may have conductive pathways (e.g., including conductive vias and lines) extending through the dielectric material between the faces, or between different locations on each face. In some embodiments, the package substrate 334 may have a thickness less than 1 millimeter (e.g., between 0.1 millimeters and 0.5 millimeters). Conductive contacts 344 may be disposed at the other face of the package substrate 334, and second-level interconnects 342 may couple these conductive contacts 344 to the antenna board 100 (not shown) in an antenna module 105. The second-level interconnects 342 illustrated in FIG. 26 are solder balls (e.g., for a ball grid array arrangement), but any suitable second-level interconnects 342 may be used (e.g., pins in a pin grid array arrangement or lands in a land grid array arrangement). A solder resist 314 may be disposed around the conductive contacts 344. In some embodiments, a mold material 340 may be disposed around the components 336 (e.g., between the components 336 and the package substrate 334 as an underfill material). In some embodiments, a thickness of the mold material may be less than 1 millimeter. Example materials that may be used for the mold material 340 include epoxy mold materials, as suitable. In some embodiments, a conformal shield 352 may be disposed around the components 336 and the package substrate 334 to provide electromagnetic shielding for the IC package 115.

The components 336 may include any suitable IC components. In some embodiments, one or more of the components 336 may include a die. For example, one or more of the components 336 may be a RF communication die. In some embodiments, one or more of the components 336 may include a resistor, capacitor (e.g., decoupling capacitors), inductor, DC-DC converter circuitry, or other circuit elements. In some embodiments, the IC package 115 may be a system-in-package (SiP). In some embodiments, the IC package 115 may be a flip chip (FC) chip scale package (CSP). In some embodiments, one or more of the components 336 may include a memory device programmed with instructions to execute beam forming, scanning, and/or codebook functions.

Figure 27:
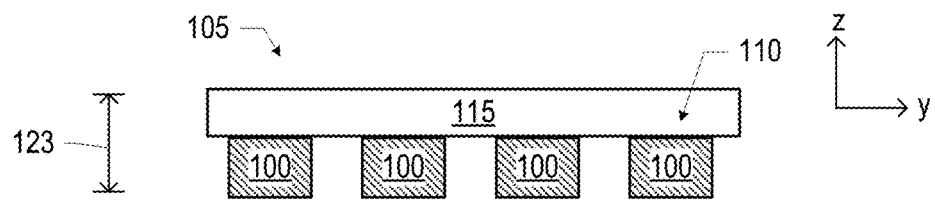
FIG. 27 is a side, cross-sectional view of another example antenna module, in accordance with various embodiments.

As noted above, in some embodiments, an antenna module 105 may include multiple antenna boards 100. For example, FIG. 27 illustrates an embodiment in which multiple antenna boards 100 are coupled to a single IC package 115. In some embodiments, a connector (not shown) may be mounted to one or more of the faces of the IC package 115 of FIG. 27 to enable the antenna module 105 to communicate with other components (e.g., a motherboard). Any suitable connector may be used (e.g., a coaxial connector, a flat cable connector, etc.).

Figure 28:
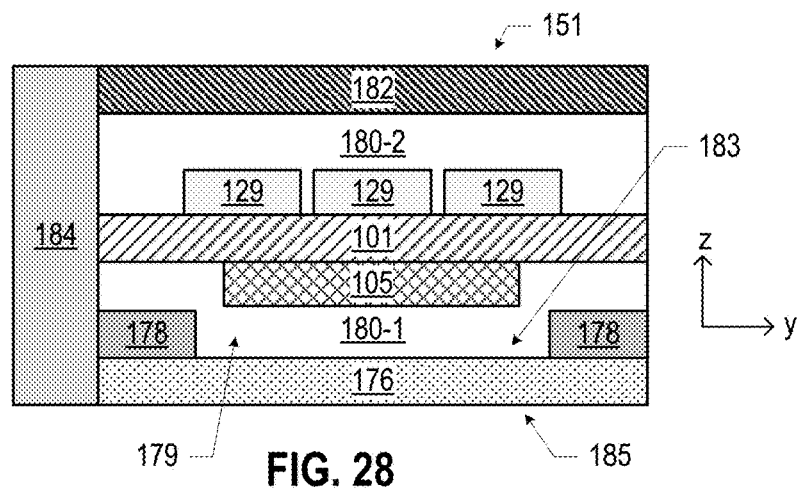
FIG. 28 is a side, cross-sectional view of a portion of an example communication device including an antenna module, in accordance with various embodiments.

The antenna boards 100 and antenna modules 105 disclosed herein may be included in any suitable communication device (e.g., a computing device with wireless communication capability, a wearable device with wireless communication circuitry, etc.). FIG. 28 is a side, cross-sectional view of a portion of a communication device 151 including an antenna module 105, in accordance with various embodiments. In particular, the communication device 151 illustrated in FIG. 28 may be a handheld communication device, such as a smart phone or tablet. The communication device 151 may include a glass or plastic back cover 176 proximate to a metallic or plastic chassis 178. In some embodiments, the chassis 178 may be laminated onto an inner face 183 of the back cover 176 (opposite to an outer face 185 of the back cover 176), or attached to the back cover 176 with an adhesive. In some embodiments, the portion of the chassis 178 adjacent to the back cover 176 may have a thickness between 0.1 millimeters and 0.4 millimeters; in some such embodiments, this portion of the chassis 178 may be formed of metal. In some embodiments, the back cover 176 may have a thickness between 0.3 millimeters and 1.5 millimeters; in some such embodiments, the back cover 176 may be formed of glass. The chassis 178 may include one or more windows 179 that align with antenna patches 104 (not shown) of the antenna module 105 to improve performance. An air cavity 180-1 may space at least some of the antenna module 105 from the back cover 176. In some embodiments, the height of the air cavity 180-1 may be between 0.5 millimeters and 3 millimeters. The antenna module 105 may be mounted to a face of the circuit board 101 (e.g., a motherboard), and other components 129 (e.g., other IC packages) may be mounted to the opposite face of the circuit board 101. In some embodiments, the circuit board 101 may have a thickness between 0.2 millimeters and 1 millimeter (e.g., between 0.3 millimeters and 0.5 millimeters). Another air cavity 180-2 may be located between the circuit board 101 and a display 182 (e.g., a touch screen display). In some embodiments, the spacing between the antenna patches 104 (not shown) of the antenna module 105 and the back cover 176 may be selected and controlled within tens of microns to achieve desired performance. The air cavity 180-2 may separate the antenna module 105 from the display 182 on the front side of the communication device 151; in some embodiments, the display 182 may have a metal layer proximate to the air cavity 180-2 to draw heat away from the display 182. A metal or plastic housing 184 may provide the "sides" of the communication device 151.

Figure 29:
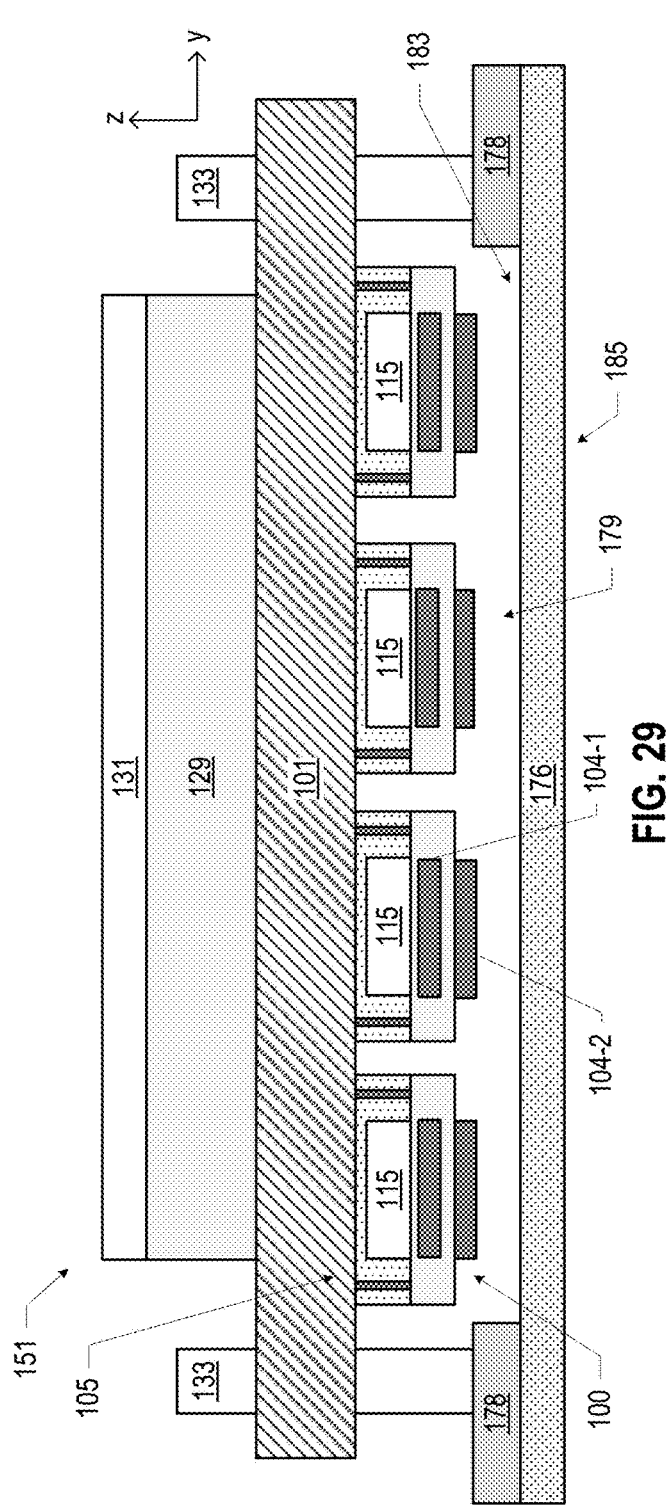
FIG. 29 is a side, cross-sectional view of a portion of an example communication device including an example antenna module, in accordance with various embodiments.
Figure 30:
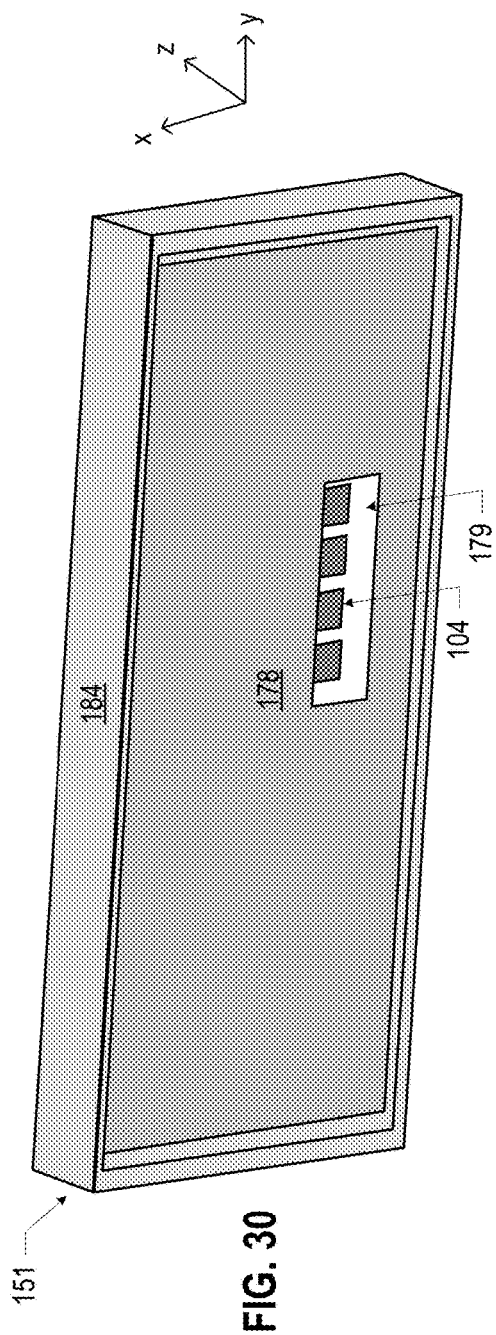
FIGS. 30-32 are various views of portions of example communication devices including antenna patches and a window, in accordance with various embodiments.

FIG. 29 is a side, cross-sectional view of a portion of an example communication device 151 including an example antenna module 105, in accordance with various embodiments. The example antenna module 105 of FIG. 29 includes two antenna patches 104 arranged in each of four antenna boards 100; the antenna boards 100 are included in antenna modules 105 like the antenna module 105 discussed above with reference to FIG. 25. The antenna modules 105 are coupled to a circuit board 101, which is itself mechanically secured to the chassis 178 by fasteners 133 (e.g., screws). In some embodiments, the fasteners 133 may be spaced apart from the proximate antenna modules 105 by a distance between 1 millimeter and 2 millimeters. A component 129 is disposed on the other face of the circuit board 101, and a heat spreader 131 is disposed on that component 129. The antenna patches 104 are proximate to a window 179 in the chassis 178.

Figure 31:
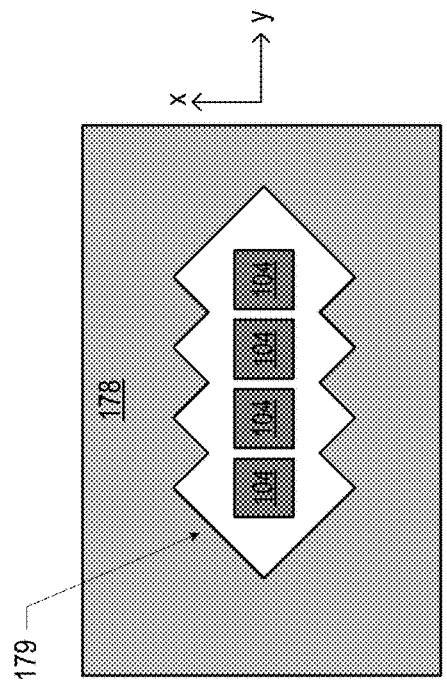
Figure 32:
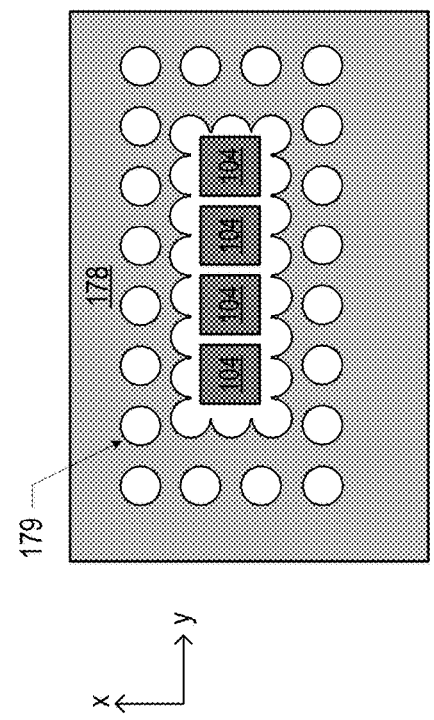

A window 179 in a chassis 178 may have any suitable shape, which may influence the near-field region of the antenna patches 104 (e.g., in a metallic chassis 178). For example, FIG. 0.30 illustrates an example communication device 151 having a rectangular window 179 in the chassis 178; an array of four antenna patches 104 (which may be part of different stacks 103 in a same antenna board 100, or different antenna boards 100) may be located above the window 179. A chassis 178 may also have non-rectangular windows 179. For example, FIG. 31 illustrates an embodiment in which the chassis 178 includes multiple windows 179; a central window 179 with scalloped edges, and multiple circular windows 179 distributed around the central window 179. FIG. 32 illustrates an embodiment in which the chassis 179 has a window 179 with a "zig zag" edge (e.g., the window 179 is shaped like an array of multiple overlapping diamonds). Other windows 179 may be used as suitable.

Figure 33:
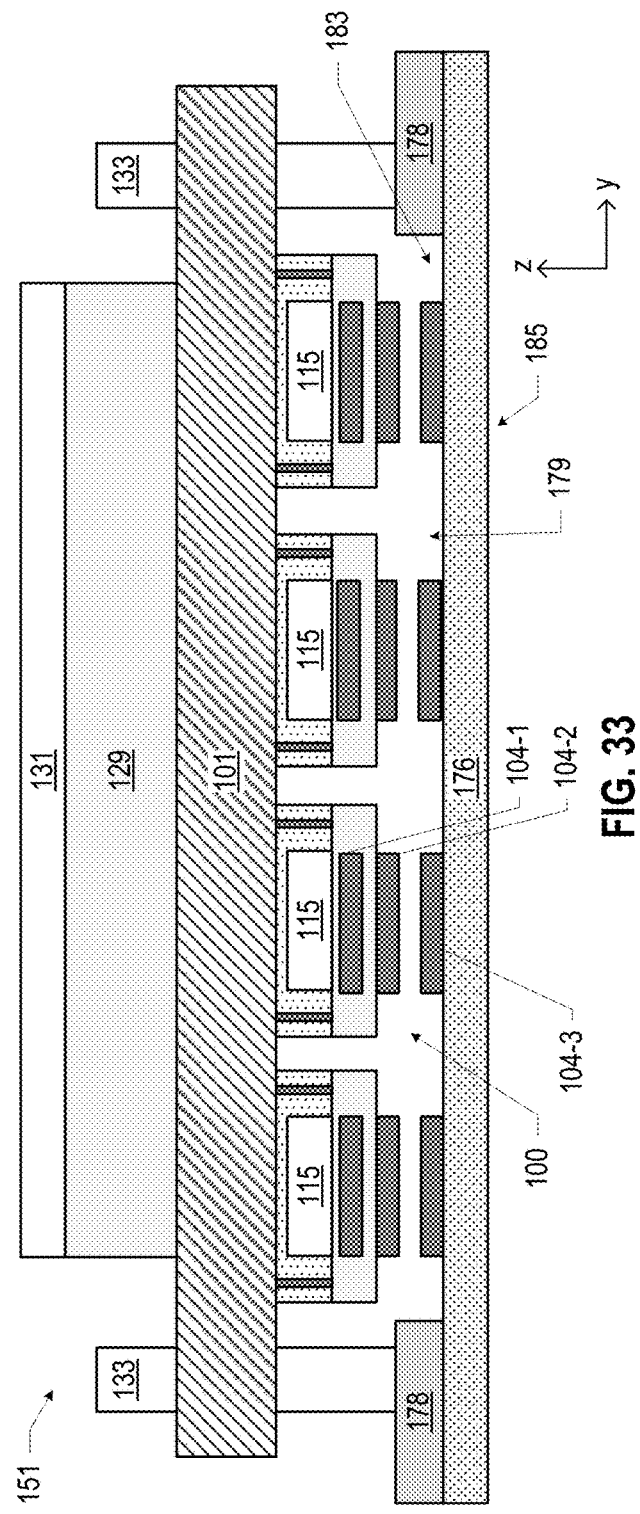
FIG. 33 is a side, cross-sectional view of a portion of an example communication device including an example antenna module, in accordance with various embodiments.

In some embodiments, additional antenna patches 104 may be printed or otherwise disposed on the inner face 183 of the back cover 176 of a communication device 151. For example, FIG. 33 illustrates an example communication device 151 similar to the communication device 151 of FIG. 29, but in which an additional antenna patch 104-3 is printed on the inner face 183 of the back cover 176 for each of the antenna modules 105. A printed antenna patch 104 may be utilized with any of the antenna boards 100 disclosed herein (e.g., an antenna board 100 that includes a single antenna patch 104), and the printed antenna patches 104 may have any suitable shape or thickness. The height of the air cavity 180-1 may control the distance between the antenna patch(es) 104 of the antenna board 100 and an antenna patch 104 printed on the inner face 183 of the back cover 176.

Figure 34:
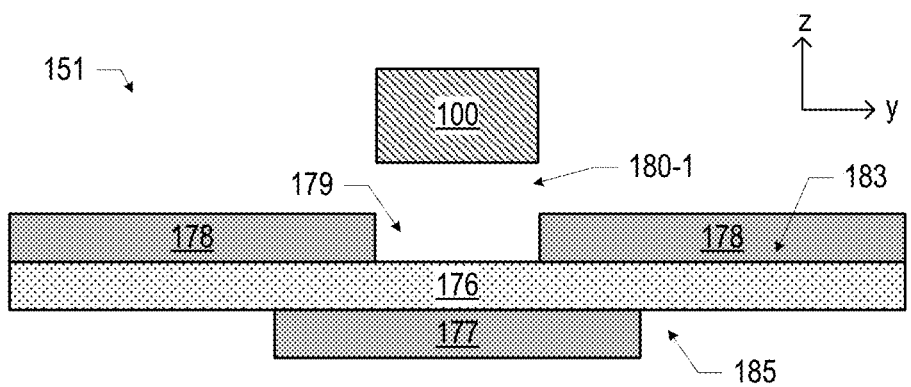
FIG. 34 is a side, cross-sectional view of a portion of an example communication device including an antenna board, in accordance with various embodiments.

In some embodiments, conductive material may be printed or otherwise disposed on the outer face 185 of the back cover 176 of a communication device. This conductive material may suppress the propagation of surface waves that arise at the interface between the ambient environment and the back cover 176 (e.g., when the back cover 176 is formed of glass) by providing a "soft-hard surface" that helps maintain desirable broadside radiation behavior and mitigate the formation of side lobes (e.g., by absorbing and/or reflecting surface waves). This may be especially significant in mobile millimeter wave communication devices 151; glass or plastic back covers 176 may have a relatively high dielectric constant, enhancing the excitation of surface waves. Conductive material (e.g., printed metallization) on the outer face 185 of the back cover 176 may provide periodic surface textures that may suppress such propagation. For example, FIG. 34 is a side, cross-sectional view of a portion of a communication device 151, depicting the chassis 178 (with a window 179) on the inner face 183 of the back cover 176, an antenna board 100 proximate to the window 179, and conductive material 177 (e.g., a metal) on the outer face 185 of the back cover 176 proximate to the windows 179. Such conductive material 177 on the outer face 185 of the back cover 176 may be particularly advantageous when the back cover 176 is glass. In some embodiments, the conductive material 177 may be metallization printed on a glass back cover 176. Such metallization may be printed to an accuracy of 5 microns, in some embodiments. In some embodiments, the material of the back cover 176 may be corrugated or otherwise non-planar at the outer face 185, which may provide a different type of soft surface that may suppress undesirable surface waves.

Figure 35:
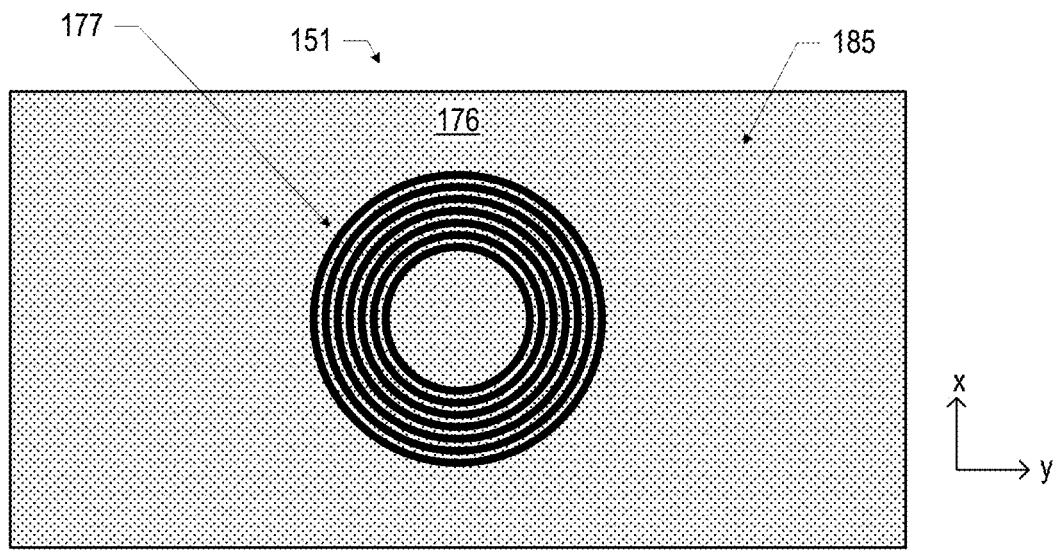
FIGS. 35-36 are bottom views of portions of example communication devices, in accordance with various embodiments.
Figure 36:
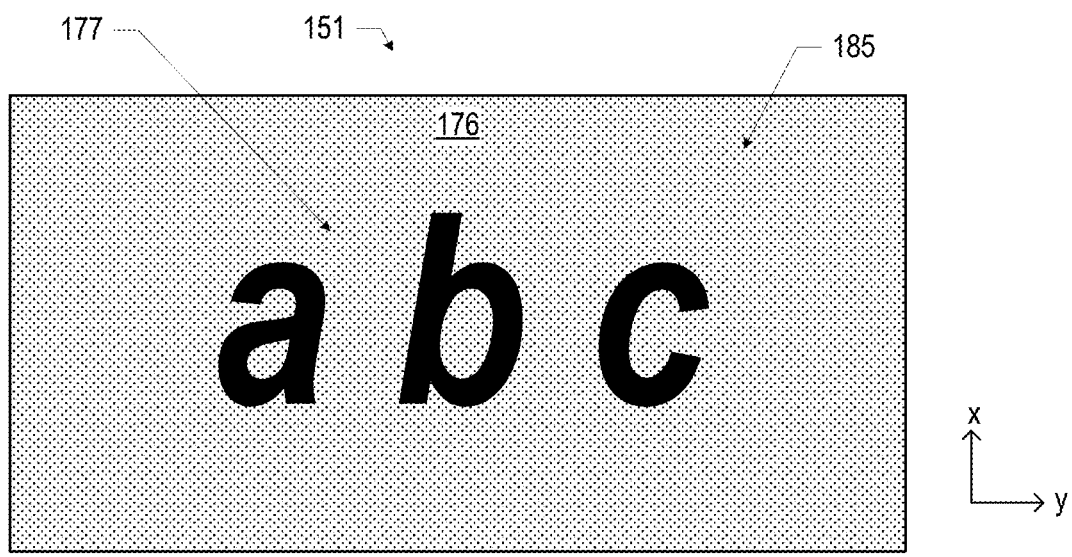

The conductive material 177 on the outer face 185 of the back cover 176 may have any desired shape. For example, FIG. 35 illustrates an embodiment in which the conductive material 177 is arranged as concentric rings (over the window 179, not shown) on the outer face 185; such an embodiment may suppress side lobes and improve directivity relative to embodiments in which the conductive material 177 is not present. FIG. 36 illustrates an embodiment in which the conductive material 177 takes the form of letters (or numbers, symbols, a company logo, etc.); any suitable pattern may be used to achieve a desired result.

Figure 37A:
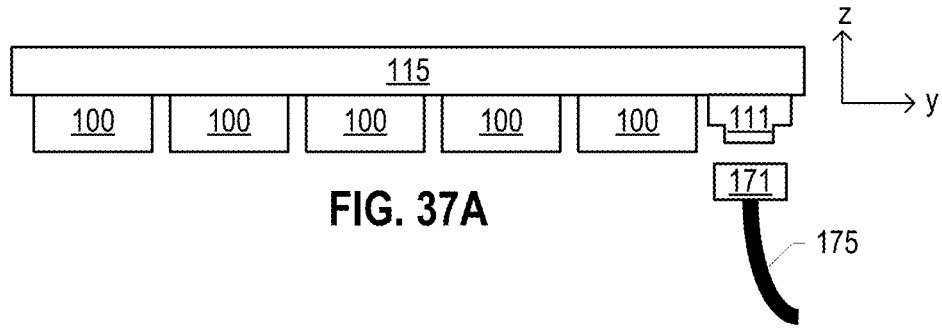
FIGS. 37A-37B are views of an example antenna module, in accordance with various embodiments.
Figure 37B:
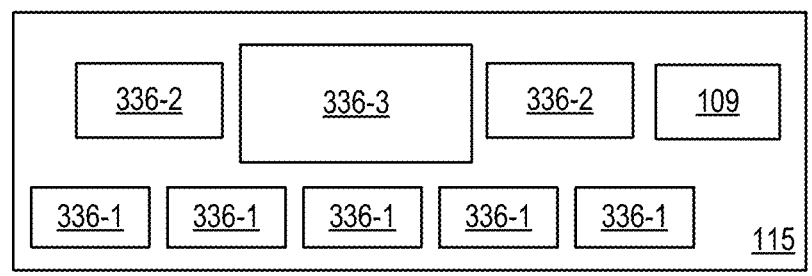
Figure 38:
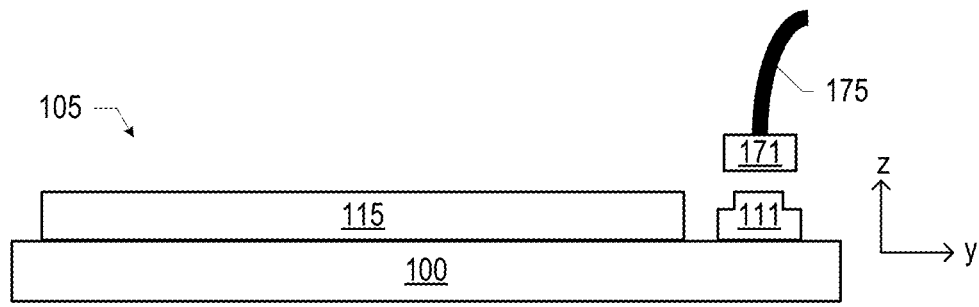
FIGS. 38-39 are side, cross-sectional views of example antenna modules, in accordance with various embodiments.
Figure 39:
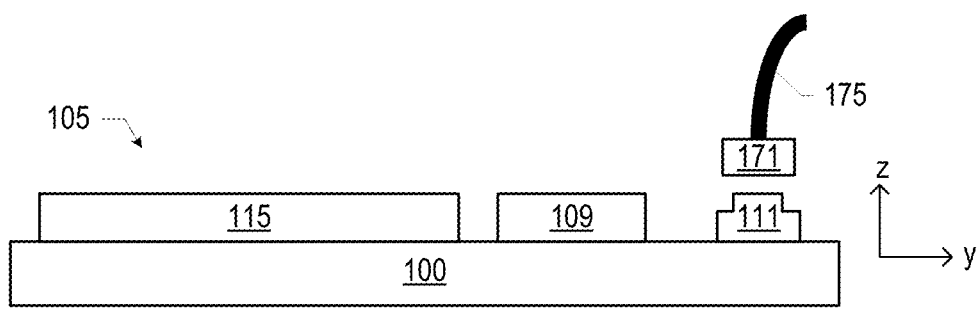

Although various ones of the accompanying drawings have illustrated the antenna board 100 as having a larger footprint than the IC package 115, the antenna board 100 and the IC package 115 (which may be, e.g., an SiP) may have any suitable relative dimensions. For example, in some embodiments, the footprint of the IC package 115 in an antenna module 105 may be larger than the footprint of the antenna board 100. Such embodiments may occur, for example, when the IC package 115 includes multiple dies as the components 336. FIGS. 37-39 illustrate various examples of antenna modules 105 in which the footprint of the IC package 115 is larger or smaller than the footprint of an antenna board 100.

As noted above, in some embodiments, an antenna module 105 may include multiple antenna boards 100. For example, FIG. 37 illustrates an embodiment in which multiple antenna boards 100 are coupled to a single IC package 115. In particular, FIG. 37A is a side, cross-sectional view, and FIG. 37B is a top view showing example components that may be included in the IC package 115. FIG. 37 also illustrates a connector 111 on the bottom face of the IC package 115, but embodiments in which multiple antenna boards 100 are coupled to a single IC package 115 may include no connectors 111 on the IC package 115, or one or more connectors 111 on the IC package 115.

As discussed above, any suitable circuitry may be included in an IC package 115. In some embodiments (e.g., the embodiments of FIGS. 37-39), the IC package 115 may include RF integrated circuits to control the operation of the antenna board 100 (e.g., one RFIC for each antenna patch 104 or stack 103), other logic and RF control circuitry, and/or DC-DC converter circuitry (if not included separately, as discussed above with reference to FIG. 38). For example, FIG. 37 illustrates an embodiment in which the IC package 115 may include one RFIC 336-1 for each antenna board 100 (e.g., disposed above their respective antenna boards 100), one or more controller modules 336-2 (e.g., to control operation of the RFICs 336-1), one or more CMOS or BiCMOS components 336-3 to perform various RF and/or control functions, and one or more DC-DC converter components 109. In some embodiments, the components 336-3 may be limited in its output power, and may feed the RFICs 3361. Further, the IC package 115 may include additional passive or active components, not shown (e.g., capacitors and other components to perform decoupling and/or biasing functions).

FIG. 38 illustrates an embodiment in which an IC package 115 is coupled to an antenna board 100, and a connector 111 also extends from the antenna board 100. The connector 111 may enable direct connection to antenna board 100 by a cable 175 having a connector 171 that mates with the connector 111; communication with the IC package 115 may take place through the antenna board 100. A connector 111 may take any suitable form (e.g., coaxial cable connectors or flat cable connectors).

FIG. 39 illustrates an embodiment similar to the embodiment of FIG. 38, but in which a DC-DC converter component 109 is coupled to the same face of the antenna board 100 as the IC package 115. The DC-DC converter component 109 is simply exemplary, and other components may be coupled to the antenna board 100 (instead of or in addition to the DC-DC converter component 109).

The antenna boards 100 and antenna modules 105 disclosed herein may include, or be included in, any suitable electronic component. FIGS. 40-43 illustrate various examples of apparatuses that may include, or may be included in, a communication device along with, any of the antenna boards 100 disclosed herein.

Figure 40:
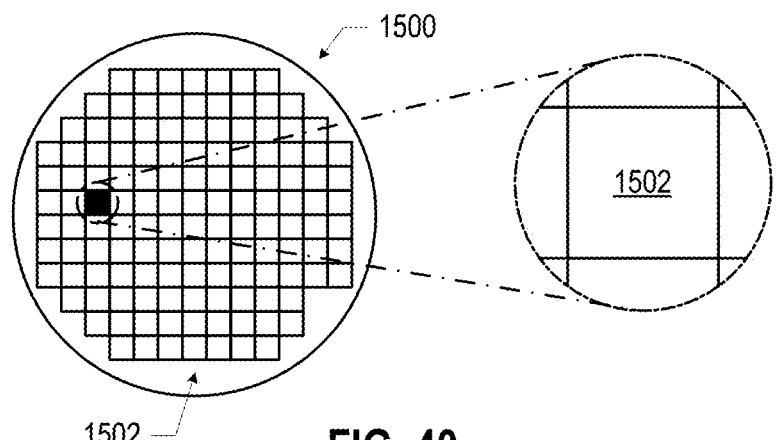
FIG. 40 is a top view of a wafer and dies that may be included in a communications device along with an antenna board, in accordance with any of the embodiments disclosed herein.

FIG. 40 is a top view of a wafer 1500 and dies 1502 that may be included in a communication device along with any of the antenna boards 100 disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 41, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 43) or other logic that is configured to store information in the memory devices or execute instructions stored in the memory array.

Figure 41:
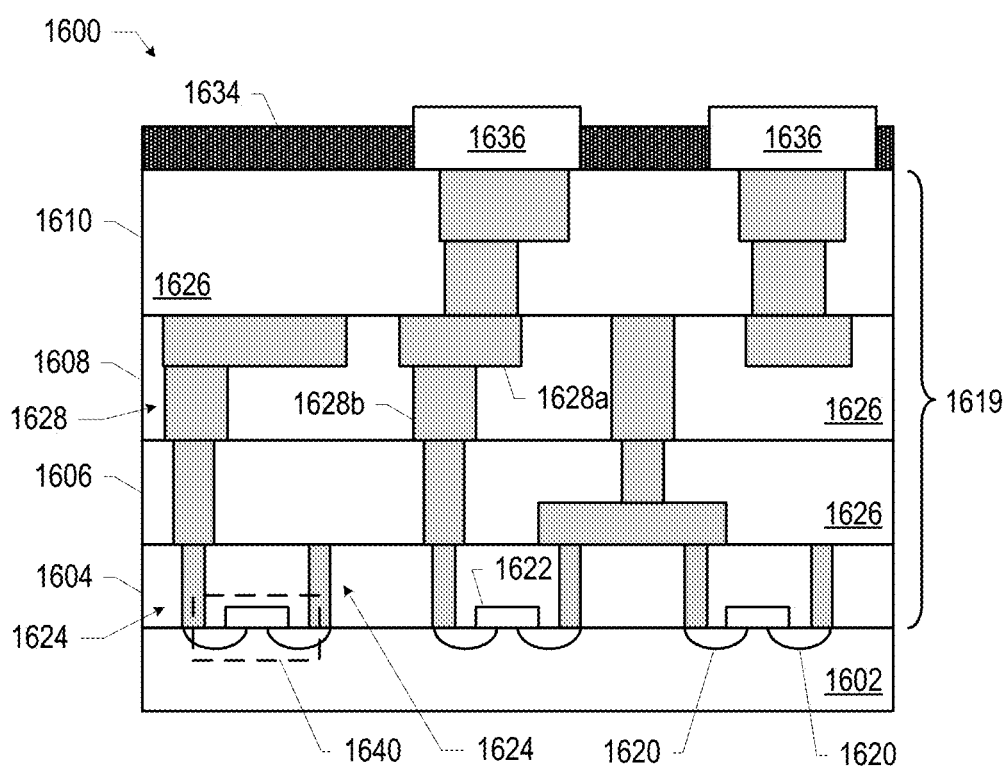
FIG. 41 is a side, cross-sectional view of an IC device that may be included in a communications device along with an antenna board, in accordance with any of the embodiments disclosed herein.

FIG. 41 is a side, cross-sectional view of an IC device 1600 that may be included in a communication device along with any of the antenna boards 100 disclosed herein. The IC device 1600 may be formed on a substrate 1602 (e.g., the wafer 1500 of FIG. 40) and may be included in a die (e.g., the die 1502 of FIG. 40). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 40) or a wafer (e.g., the wafer 1500 of FIG. 40).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 41 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 41 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 41). Although a particular number of interconnect layers 1606-1610 is depicted in FIG. 41, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628*a* may route electrical signals in a direction in and out of the page from the perspective of FIG. 41. The vias 1628*b* may be arranged to route electrical signals in a direction of a plane that is substantially perpendicular to the surface of the substrate 1602 upon which the device layer 1604 is formed. In some embodiments, the vias 1628*b* may electrically couple lines 1628*a* of different interconnect layers 1606-1610 together.

The interconnect layers 1606-1610 may include a dielectric material 1626 disposed between the interconnect structures 1628, as shown in FIG. 41. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628*a* and/or vias 1628*b*, as shown. The lines 1628*a* of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 41, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 42:
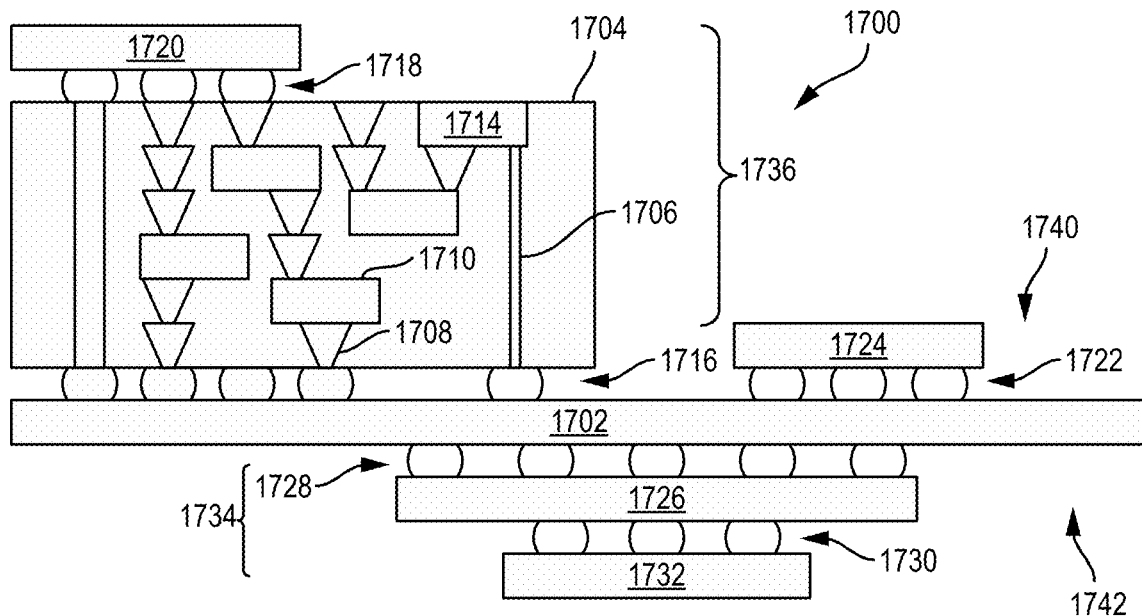
FIG. 42 is a side, cross-sectional view of an IC device assembly that may include an antenna board, in accordance with any of the embodiments disclosed herein.

FIG. 42 is a side, cross-sectional view of an IC device assembly 1700 that may include one or more of the antenna boards 100 disclosed herein. In particular, any suitable ones of the antenna boards 100 disclosed herein may take the place of any of the components of the IC device assembly 1700 (e.g., an antenna board 100 may take the place of any of the IC packages of the IC device assembly 1700).

The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 42 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 42), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 42, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 40), an IC device (e.g., the IC device 1600 of FIG. 41), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 42, the IC package 1720 and the circuit board 1702 are attached to opposing sides of the interposer 1704; in other embodiments, the IC package 1720 and the circuit board 1702 may be attached to the same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 42 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 43:
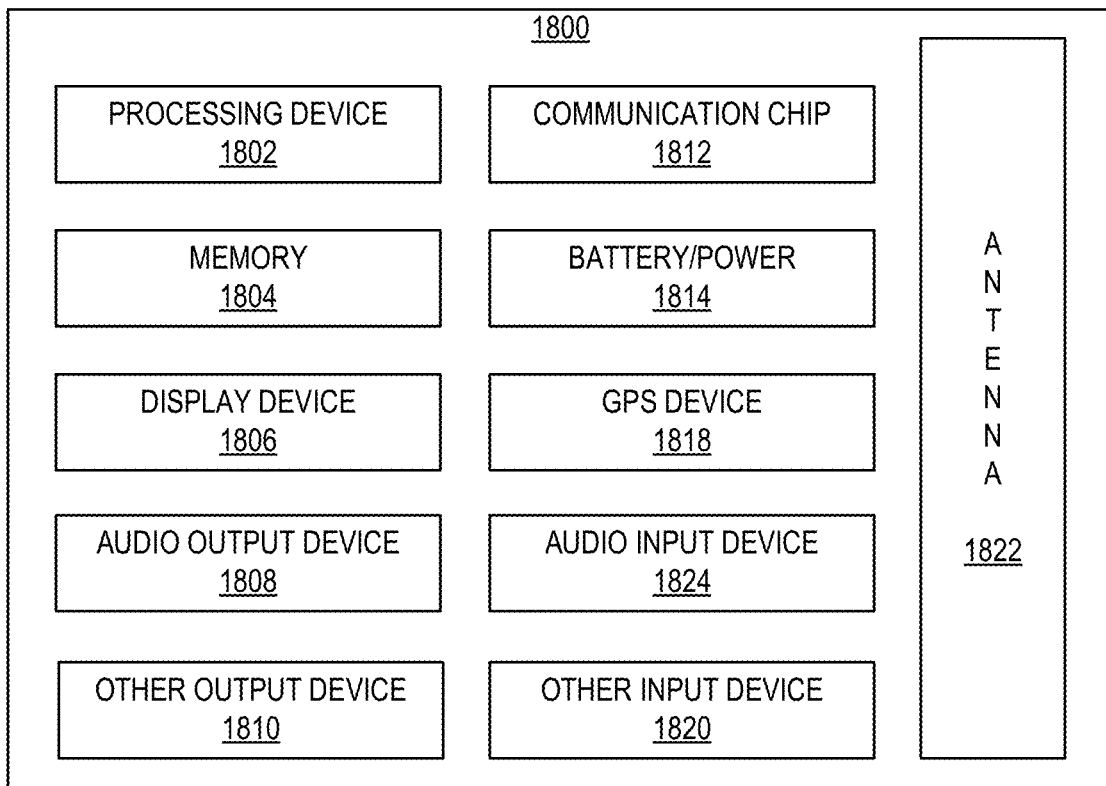
FIG. 43 is a block diagram of an example communication device that may include an antenna board, in accordance with any of the embodiments disclosed herein.

FIG. 43 is a block diagram of an example communication device 1800 that may include one or more antenna boards 100, in accordance with any of the embodiments disclosed herein. For example, the communication device 151 (FIG. 41) may be an example of the communication device 1800. Any suitable ones of the components of the communication device 1800 may include one or more of the IC packages 1650, IC devices 1600, or dies 1502 disclosed herein. A number of components are illustrated in FIG. 43 as included in the communication device 1800, but any one or more of these components may be omitted or duplicated, as suitable for the application. In some embodiments, some or all of the components included in the communication device 1800 may be attached to one or more motherboards. In some embodiments, some or all of these components are fabricated onto a single system-on-a-chip (SoC) die.

Additionally, in various embodiments, the communication device 1800 may not include one or more of the components illustrated in FIG. 43, but the communication device 1800 may include interface circuitry for coupling to the one or more components. For example, the communication device 1800 may not include a display device 1806, but may include display device interface circuitry (e.g., a connector and driver circuitry) to which a display device 1806 may be coupled. In another set of examples, the communication device 1800 may not include an audio input device 1824 or an audio output device 1808, but may include audio input or output device interface circuitry (e.g., connectors and supporting circuitry) to which an audio input device 1824 or audio output device 1808 may be coupled.

The communication device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The communication device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the communication device 1800 may include a communication module 1812 (e.g., one or more communication modules). For example, the communication module 1812 may be configured for managing wireless communications for the transfer of data to and from the communication device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communication module 1812 may be, or may include, any of the antenna boards 100 disclosed herein.

The communication module 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication module 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication module 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication module 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication module 1812 may operate in accordance with other wireless protocols in other embodiments. The communication device

1800 may include an antenna 1822 to facilitate wireless communications and/or to receive other wireless communications (such as AM or FM radio transmissions).

In some embodiments, the communication module 1812 may manage wired communications, such as electrical, optical, or any other suitable communication protocols (e.g., the Ethernet). As noted above, the communication module 1812 may include multiple communication modules. For instance, a first communication module 1812 may be dedicated to shorter-range wireless communications such as Wi-Fi or Bluetooth, and a second communication module 1812 may be dedicated to longer-range wireless communications such as global positioning system (GPS), EDGE, GPRS, CDMA, WiMAX, LTE, EV-DO, or others. In some embodiments, a first communication module 1812 may be dedicated to wireless communications, and a second communication module 1812 may be dedicated to wired communications. In some embodiments, the communication module 1812 may include an antenna board 100 that supports millimeter wave communication.

The communication device 1800 may include battery/power circuitry 1814. The battery/power circuitry 1814 may include one or more energy storage devices (e.g., batteries or capacitors) and/or circuitry for coupling components of the communication device 1800 to an energy source separate from the communication device 1800 (e.g., AC line power).

The communication device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The communication device 1800 may include an audio output device 1808 (or corresponding interface circuitry, as discussed above). The audio output device 1808 may include any device that generates an audible indicator, such as speakers, headsets, or earbuds.

The communication device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The communication device 1800 may include a GPS device 1818 (or corresponding interface circuitry, as discussed above). The GPS device 1818 may be in communication with a satellite-based system and may receive a location of the communication device 1800, as known in the art.

The communication device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The communication device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The communication device 1800 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 1800 may be any other electronic device that processes data.

The following paragraphs provide examples of various ones of the embodiments disclosed herein.

Example 1 is an antenna board, including: an antenna feed substrate including an antenna feed structure, wherein the antenna feed substrate includes a ground plane, the antenna feed structure includes a first portion perpendicular to the ground plane and a second portion parallel to the ground plane, and the first portion is electrically coupled between the second portion and the first portion; and an antenna patch, wherein the antenna patch is a millimeter wave antenna patch.

Example 2 may include the subject matter of Example 1, and may further include:
an air cavity.

Example 3 may include the subject matter of Example 2, and may further specify that the air cavity is between the antenna patch and the antenna feed substrate.

Example 4 may include the subject matter of Example 2, and may further specify that the air cavity is between the ground plane and the second portion of the antenna feed structure.

Example 5 may include the subject matter of any of Examples 2-4, and may further specify that the antenna patch is a first antenna patch, the air cavity is a first air cavity, and the antenna board further includes a second antenna patch and a second air cavity between the first antenna patch and the second antenna patch.

Example 6 may include the subject matter of any of Examples 1-5, and may further specify that the antenna board does not include a conductive material pathway between the antenna feed structure and the antenna patch.

Example 7 may include the subject matter of any of Examples 1-6, and may further specify that the antenna feed structure further includes a third portion perpendicular to the ground plane and a fourth portion parallel to the ground plane, the fourth portion is electrically coupled to the first portion, and the third portion is electrically coupled between the fourth portion and the ground plane.

Example 8 may include the subject matter of Example 7, and may further specify that the fourth portion is perpendicular to the second portion.

Example 9 may include the subject matter of any of Examples 7-8, and may further specify that the antenna feed structure further includes a fifth portion perpendicular to the antenna patch and a sixth portion parallel to the antenna patch, and the fifth portion is electrically coupled between the sixth portion and the antenna patch.

Example 10 may include the subject matter of Example 9, and may further specify that the antenna board does not include a conductive material pathway between the sixth portion and the fourth portion.

Example 11 may include the subject matter of any of Examples 1-8, and may further specify that the antenna feed structure is a first antenna feed structure, and the antenna feed substrate further includes a second antenna feed structure oriented perpendicular to the first antenna feed structure.

Example 12 may include the subject matter of Example 11, and may further specify that the antenna patch is a first antenna patch, the first and second antenna feed structures are to feed the first antenna patch, the antenna board further includes a second antenna patch, a third antenna feed structure and a fourth antenna feed structure, and the third and fourth antenna feed structures are to feed the second antenna patch.

Example 13 may include the subject matter of Example 12, and may further include: a third antenna patch; and a fourth antenna patch; wherein the first and second antenna feed structures are to feed the third antenna patch, and the third and fourth antenna feed structures are to feed the fourth antenna patch.

Example 14 may include the subject matter of any of Examples 12-13, and may further specify that the first antenna patch and the second antenna patch are diagonally offset.

Example 15 may include the subject matter of any of Examples 1-14, and may further specify that the antenna feed structure includes solder.

Example 16 may include the subject matter of any of Examples 1-15, and may further include: a conductive ring around the antenna patch.

Example 17 may include the subject matter of any of Examples 1-16, and may further include: a plurality of shield posts around the antenna feed structure.

Example 18 may include the subject matter of any of Examples 1-17, and may further specify that the antenna patch has a thickness between 5 microns and 30 microns.

Example 19 may include the subject matter of any of Examples 1-18, and may further specify that the antenna board has a thickness between 500 microns and 2 millimeters.

Example 20 is an antenna board, including: an antenna feed substrate including an antenna feed structure and a ground plane; an antenna patch, wherein the antenna patch is a millimeter wave antenna patch; an air cavity between the antenna patch and the ground plane; and an electrical component disposed in the air cavity, wherein the antenna feed substrate includes conductive pathways to the electrical component.

Example 21 may include the subject matter of Example 20, and may further specify that the electrical component includes a die, a switch, an amplifier, an inductor, a varactor, or a capacitor.

Example 22 may include the subject matter of any of Examples 20-21, and may further specify that the electrical component has an electrical property that is tunable by electrical signals transmitted to the electrical component via the conductive pathways.

Example 23 may include the subject matter of any of Examples 20-22, and may further specify that the electrical component is coupled to the antenna feed substrate by solder or wirebonds.

Example 24 may include the subject matter of any of Examples 20-23, and may further specify that the antenna patch has a thickness between 5 microns and 30 microns.

Example 25 may include the subject matter of any of Examples 20-24, and may further specify that the antenna board has a thickness between 500 microns and 2 millimeters.

Example 26 may include the subject matter of any of Examples 20-25, and may further specify that the air cavity has a thickness between 100 microns and 300 microns.

Example 27 is an antenna module, including: an integrated circuit (IC) package; and an antenna board, wherein the antenna board is coupled to the IC package, and the antenna board includes: an antenna feed substrate including an antenna feed structure, wherein the antenna feed substrate includes a ground plane, the antenna feed structure includes a first portion perpendicular to the ground plane and a second portion parallel to the ground plane, and the first portion is electrically coupled between the second portion and the first portion, and an antenna patch, wherein the antenna patch is a millimeter wave antenna patch.

Example 28 may include the subject matter of Example 27, and may further include an air cavity.

Example 29 may include the subject matter of Example 28, and may further specify that the air cavity is between the antenna patch and the antenna feed substrate.

Example 30 may include the subject matter of Example 28, and may further specify that the air cavity is between the ground plane and the second portion of the antenna feed structure.

Example 31 may include the subject matter of any of Examples 28-30, and may further specify that the antenna patch is a first antenna patch, the air cavity is a first air cavity, and the antenna board further includes a second antenna patch and a second air cavity between the first antenna patch and the second antenna patch.

Example 32 may include the subject matter of any of Examples 27-31, and may further specify that the antenna board does not include a conductive material pathway between the antenna feed structure and the antenna patch.

Example 33 may include the subject matter of any of Examples 27-32, and may further specify that the antenna feed structure further includes a third portion perpendicular to the ground plane and a fourth portion parallel to the ground plane, the fourth portion is electrically coupled to the first portion, and the third portion is electrically coupled between the fourth portion and the ground plane.

Example 34 may include the subject matter of Example 33, and may further specify that the fourth portion is perpendicular to the second portion.

Example 35 may include the subject matter of any of Examples 33-34, and may further specify that the antenna feed structure further includes a fifth portion perpendicular to the antenna patch and a sixth portion parallel to the antenna patch, and the fifth portion is electrically coupled between the sixth portion and the antenna patch.

Example 36 may include the subject matter of Example 35, and may further specify that the antenna board does not include a conductive material pathway between the sixth portion and the fourth portion.

Example 37 may include the subject matter of any of Examples 28-36, and may further specify that the antenna feed structure is a first antenna feed structure, and the antenna feed substrate further includes a second antenna feed structure oriented perpendicular to the first antenna feed structure.

Example 38 may include the subject matter of Example 37, and may further specify that the antenna patch is a first antenna patch, the first and second antenna feed structures are to feed the first antenna patch, the antenna board further includes a second antenna patch, a third antenna feed structure and a fourth antenna feed structure, and the third and fourth antenna feed structures are to feed the second antenna patch.

Example 39 may include the subject matter of Example 38, and may further include: a third antenna patch; and a fourth antenna patch; wherein the first and second antenna feed structures are to feed the third antenna patch, and the third and fourth antenna feed structures are to feed the fourth antenna patch.

Example 40 may include the subject matter of any of Examples 38-39, and may further specify that the first antenna patch and the second antenna patch are diagonally offset.

Example 41 may include the subject matter of any of Examples 28-40, and may further specify that the antenna feed structure includes solder.

Example 42 may include the subject matter of any of Examples 28-41, and may further include: a conductive ring around the antenna patch.

Example 43 may include the subject matter of any of Examples 28-42, and may further include: a plurality of shield posts around the antenna feed structure.

Example 44 may include the subject matter of any of Examples 28-43, and may further specify that the antenna patch has a thickness between 5 microns and 30 microns.

Example 45 may include the subject matter of any of Examples 28-44, and may further specify that the antenna board has a thickness between 500 microns and 2 millimeters.

Example 46 may include the subject matter of any of Examples 28-45, and may further specify that the IC package includes a radio frequency (RF) communication die.

Example 47 may include the subject matter of any of Examples 28-46, and may further specify that the IC package includes a memory device programmed with instructions to execute beam forming, scanning, and/or codebook functions.

Example 48 may include the subject matter of any of Examples 28-47, and may further specify that the antenna board is a first antenna board, and the antenna module further includes a second antenna module coupled to the IC package.

Example 49 may include the subject matter of any of Examples 28-48, and may further specify that the IC package is a first IC package, and the antenna module further includes a second IC package coupled to the antenna board.

Example 50 is an antenna module, including: an integrated circuit (IC) package; and an antenna board, wherein the antenna board is coupled to the IC package, and the antenna board includes: an antenna feed substrate including an antenna feed structure and a ground plane, an antenna patch, wherein the antenna patch is a millimeter wave antenna patch, an air cavity between the antenna patch and the ground plane, and an electrical component disposed in the air cavity, wherein the antenna feed substrate includes conductive pathways to the electrical component.

Example 51 may include the subject matter of Example 50, and may further specify that the electrical component includes a die, a switch, an amplifier, an inductor, a varactor, or a capacitor.

Example 52 may include the subject matter of any of Examples 50-51, and may further specify that the electrical component has an electrical property that is tunable by electrical signals transmitted to the electrical component via the conductive pathways.

Example 53 may include the subject matter of any of Examples 50-52, and may further specify that the electrical component is coupled to the antenna feed substrate by solder or wirebonds.

Example 54 may include the subject matter of any of Examples 50-53, and may further specify that the antenna patch has a thickness between 5 microns and 30 microns.

Example 55 may include the subject matter of any of Examples 50-54, and may further specify that the antenna board has a thickness between 500 microns and 2 millimeters.

Example 56 may include the subject matter of any of Examples 50-55, and may further specify that the air cavity has a thickness between 100 microns and 300 microns.

Example 57 may include the subject matter of any of Examples 50-56, and may further specify that the IC package includes a radio frequency (RF) communication die.

Example 58 may include the subject matter of any of Examples 50-57, and may further specify that the IC package includes a memory device programmed with instructions to execute beam forming, scanning, and/or codebook functions.

Example 59 may include the subject matter of any of Examples 50-58, and may further specify that the antenna board is a first antenna board, and the antenna module further includes a second antenna module coupled to the IC package.

Example 60 may include the subject matter of any of Examples 50-59, and may further specify that the IC package is a first IC package, and the antenna module further includes a second IC package coupled to the antenna board.

Example 61 is a communication device, including: a chassis; an antenna patch; and a window in the chassis, proximate to the antenna patch, wherein the window is non-rectangular.

Example 62 may include the subject matter of Example 61, and may further specify that the chassis includes a metal.

Example 63 may include the subject matter of any of Examples 61-62, and may further include: a back cover on the chassis over the window.

Example 64 may include the subject matter of Example 63, and may further specify that the back cover includes glass.

Example 65 may include the subject matter of any of Examples 63-64, and may further specify that the antenna patch is a first antenna patch, and the communication device further includes a second antenna patch on the back cover.

Example 66 may include the subject matter of Example 65, and may further specify that the second antenna patch is on an interior face of the back cover.

Example 67 may include the subject matter of any of Examples 63-66, and may further include: conductive material on an outer face of the back cover.

Example 68 may include the subject matter of Example 67, and may further specify that the conductive material includes printed metallization.

Example 69 may include the subject matter of any of Examples 61-68, and may further specify that the antenna patch is included in an antenna board, and the antenna board includes an air cavity.

Example 70 may include the subject matter of any of Examples 61-69, and may further specify that the antenna patch is one of a plurality of antenna patches arranged in an array, the window is proximate to the array of antenna patches.

Example 71 may include the subject matter of any of Examples 61-70, and may further specify that the communication device is a handheld communication device.

Example 72 may include the subject matter of any of Examples 61-71, and may further include: a display.

Example 73 may include the subject matter of Example 72, and may further specify that the display is a touch display.

Example 74 may include the subject matter of any of Examples 72-73, and may further specify that the antenna patch is between the display and the window.

Example 75 is a communication device, including: a display; a back cover; and an antenna patch on an interior face of the back cover.

Example 76 may include the subject matter of Example 75, and may further specify that the antenna patch is printed on the back cover.

Example 77 may include the subject matter of any of Examples 75-76, and may further specify that the back cover includes glass.

Example 78 may include the subject matter of any of Examples 75-77, and may further specify that the antenna patch is a first antenna patch, the communication device further includes a second antenna patch parallel to, and spaced away from, the first antenna patch.

Example 79 may include the subject matter of Example 78, and may further specify that the second antenna patch is included in an antenna module between the back cover and the display.

Example 80 may include the subject matter of any of Examples 78-79, and may further specify that the second antenna patch is between the first antenna patch and the display.

Example 81 may include the subject matter of any of Examples 75-80, and may further include: a chassis in contact with at least a portion of the interior face of the back cover; and a window in the chassis, proximate to the antenna patch.

Example 82 may include the subject matter of Example 81, and may further specify that the window is non-rectangular.

Example 83 may include the subject matter of any of Examples 81-82, and may further specify that the chassis includes a metal.

Example 84 may include the subject matter of any of Examples 75-83, and may further include: conductive material on an outer face of the back cover.

Example 85 may include the subject matter of Example 84, and may further specify that the conductive material includes printed metallization.

Example 86 may include the subject matter of any of Examples 75-85, and may further specify that the communication device is a handheld communication device.

Example 87 may include the subject matter of any of Examples 75-86, and may further specify that the display is a touch display.

Example 88 may include the subject matter of any of Examples 75-87, and may further specify that the antenna patch is a millimeter wave antenna patch.

Example 89 is a communication device, including: a display; a back cover; a millimeter wave antenna patch between the display and the back cover; and conductive material on an outer face of the back cover.

Example 90 may include the subject matter of Example 89, and may further specify that the conductive material includes printed metallization.

Example 91 may include the subject matter of any of Examples 89-90, and may further specify that the conductive material has a pattern including one or more rings of conductive material.

Example 92 may include the subject matter of any of Examples 89-91, and may further specify that the conductive material has a pattern including one or more letters or numbers.

Example 93 may include the subject matter of any of Examples 89-92, and may further include: a chassis in contact with at least a portion of an interior face of the back cover; and a window in the chassis, proximate to the antenna patch.

Example 94 may include the subject matter of Example 93, and may further specify that the window is non-rectangular.

Example 95 may include the subject matter of any of Examples 93-94, and may further specify that the chassis includes a metal.

Example 96 may include the subject matter of any of Examples 89-95, and may further specify that the communication device is a handheld communication device.

Example 97 may include the subject matter of any of Examples 89-96, and may further specify that the display is a touch display.

The invention claimed is:

1. An antenna module, comprising:
   an antenna board and a die coupled to the antenna board, wherein the antenna board includes:
   a ground plane;
   an antenna feed structure;
   a stack of antenna patches parallel to the ground plane;
   a conductive ring around a first antenna patch of the stack of antenna patches, wherein the first antenna patch is an antenna patch that is closer to the antenna feed structure than all other antenna patches of the stack of antenna patches; and
   conductive posts around the antenna feed structure, wherein the conductive posts are in conductive contact with the ground plane and with the conductive ring,
   wherein the first antenna patch is an only antenna patch surrounded by the conductive ring, and no portion of the antenna feed structure is in conductive contact with the first antenna patch.

2. The antenna module of claim 1, wherein:
   the stack of antenna patches further includes a second antenna patch spaced apart from the first antenna patch,
   the first antenna patch is between the second antenna patch and the antenna feed structure,
   the conductive ring is a first conductive ring, and
   the antenna board further includes a second conductive ring around the second antenna patch.

3. The antenna module of claim 2, wherein one or more of the first antenna patch and the second antenna patch has a rectangular footprint.

4. The antenna module of claim 2, wherein the second conductive ring has a rectangular inner perimeter.

5. The antenna module of claim 2, wherein the antenna board further includes a third conductive ring between the first conductive ring and the second conductive ring.

6. The antenna module of claim 5, wherein the third conductive ring has a rectangular inner perimeter.

7. The antenna module of claim 5, wherein the antenna board further includes further conductive posts in conductive contact with the first conductive ring, the second conductive ring, and the third conductive ring.

8. The antenna module of claim 2, wherein the first antenna patch has a thickness between 5 microns and 30 microns.

9. The antenna module of claim 2, wherein the second antenna patch has a thickness between 5 microns and 30 microns.

10. The antenna module of claim 2, wherein the antenna board further includes further conductive posts in conductive contact with the first conductive ring and the second conductive ring.

11. The antenna module of claim 1, wherein the antenna board has a thickness between 500 microns and 2 millimeters.

12. The antenna module of claim 1, wherein the antenna feed structure includes a first portion perpendicular to the ground plane and a second portion parallel to the ground plane, and wherein the stack of antenna patches is separated from the second portion of the antenna feed structure in a direction perpendicular to the ground plane by a solid dielectric material having a thickness between 50 microns and 200 microns.

13. A handheld communication device, comprising:
an antenna module, including an antenna board and a die coupled to the antenna board; and
a circuit board electrically coupled to the antenna module, wherein the antenna board includes:
a ground plane,
an antenna feed structure,
a stack of antenna patches parallel to the ground plane,
an antenna patch of the stack of antenna patches in a layer parallel to the ground plane, wherein the antenna patch is closer to the antenna feed structure than all other antenna patches of the stack of antenna patches,
a conductive ring around the antenna patch, and
conductive posts around the antenna feed structure,
wherein the conductive posts are in conductive contact with the ground plane and with the conductive ring, the antenna patch is an only antenna patch within a perimeter of the conductive ring, and the antenna feed structure is not coupled to the antenna patch by a conductive material pathway.

14. The handheld communication device of claim 13, wherein:
the antenna patch is a first antenna patch,
the stack of antenna patches further includes: a second antenna patch spaced apart from the first antenna patch, and
the first antenna patch is between the second antenna patch and the antenna feed structure.

15. The handheld communication device of claim 14, wherein at least one of the first antenna patch and the second antenna patch has a rectangular footprint.

16. The handheld communication device of claim 14, wherein the conductive ring is a first conductive ring, and wherein the antenna board further includes a second conductive ring around the second antenna patch.

17. The handheld communication device of claim 16, wherein the second conductive ring has a rectangular inner perimeter.

18. The handheld communication device of claim 14, wherein the first antenna patch has a thickness between 5 microns and 30 microns.

19. The handheld communication device of claim 14, wherein the second antenna patch has a thickness between 5 microns and 30 microns.

20. The handheld communication device of claim 13, wherein the antenna board has a thickness between 500 microns and 2 millimeters.

21. The handheld communication device of claim 13, further comprising:
a back, wherein the back includes plastic; and
an air gap between the antenna patch and the back.

22. The handheld communication device of claim 13, further comprising:
a touchscreen display; and
a back,
wherein the antenna module is at least partially between the touchscreen display and the back.

23. The handheld communication device of claim 22, wherein the antenna module is entirely between the touchscreen display and the back.

24. The handheld communication device of claim 13, further comprising a speaker.

25. The handheld communication device of claim 13, further comprising a back, wherein the back includes plastic.

26. The handheld communication device of claim 13, wherein the handheld communication device is a smartphone.

27. The handheld communication device of claim 13, wherein the antenna feed structure includes a first portion perpendicular to the ground plane and a second portion parallel to the ground plane.

28. The handheld communication device of claim 13, wherein the antenna patch is separated from a portion of the antenna feed structure parallel to the ground plane in a direction perpendicular to the ground plane by a solid dielectric material having a thickness between 50 microns and 200 microns.

29. An antenna board, comprising:
an antenna feed substrate including an antenna feed structure, wherein the antenna feed substrate includes a ground plane;
a stack of antenna patches parallel to the ground plane;
an antenna patch of the stack of antenna patches parallel to the ground plane, wherein the antenna patch is closer to the antenna feed structure than all other antenna patches of the stack of antenna patches, and wherein the antenna patch is spaced apart from the antenna feed structure and no portion of the antenna feed structure is in conductive contact with the antenna patch;
a ring comprising metal around the antenna patch, wherein no other antenna patches of the stack of antenna patches are surrounded by the ring; and
pillars comprising a conductive material around the antenna feed structure, wherein the pillars are connected to the ground plane and the ring.

30. The antenna board of claim 29, further comprising a cavity.

31. The antenna board of claim 30, wherein the cavity is between the antenna patch and the antenna feed substrate.

32. The antenna board of claim 30, wherein the cavity is between the ground plane and a portion of the antenna feed structure parallel to the ground plane.

33. The antenna board of claim 30, wherein the antenna patch is a first antenna patch, the cavity is a first cavity, and the antenna board further includes a second antenna patch and a second cavity between the first antenna patch and the second antenna patch.

34. The antenna board of claim 29, wherein the antenna feed structure includes solder.

35. The antenna board of claim 29, wherein the antenna board has a thickness between 500 microns and 2 millimeters.

36. The antenna board of claim 29, wherein the antenna patch is a millimeter wave antenna patch.

37. The antenna board of claim 29, wherein the antenna patch has a thickness between 5 microns and 30 microns.

* * * * *

UNITED STATES PATENT AND TRADEMARK OFFICE
CERTIFICATE OF CORRECTION

| | | |
|---|---|---|
| PATENT NO. | : 12,218,408 B2 | Page 1 of 1 |
| APPLICATION NO. | : 17/231051 | |
| DATED | : February 4, 2025 | |
| INVENTOR(S) | : Trang Thai et al. | |

It is certified that error appears in the above-identified patent and that said Letters Patent is hereby corrected as shown below:

On the Title Page

Item (72), under "Inventors", in Column 1, Line 4, delete "Taufkirchena" and insert -- Taufkirchen --, therefor.

Signed and Sealed this
Eleventh Day of March, 2025

Coke Morgan Stewart
*Acting Director of the United States Patent and Trademark Office*